(12) United States Patent
Song et al.

(10) Patent No.: US 10,181,427 B2
(45) Date of Patent: Jan. 15, 2019

(54) SEMICONDUCTOR DEVICES AND METHODS FOR FABRICATING THE SAME

(71) Applicant: Samsung Electronics Co., Ltd., Suwon-si, Gyeonggi-do (KR)

(72) Inventors: Moon Kyun Song, Anyang-si (KR); Yoon Tae Hwang, Seoul (KR); Kyu Min Lee, Hwaseong-si (KR); Soo Jung Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/858,403

(22) Filed: Dec. 29, 2017

(65) Prior Publication Data
US 2018/0226300 A1   Aug. 9, 2018

(30) Foreign Application Priority Data

Feb. 6, 2017 (KR) .................. 10-2017-0016165

(51) Int. Cl.
| | |
|---|---|
| *H01L 29/49* | (2006.01) |
| *H01L 21/8238* | (2006.01) |
| *H01L 27/092* | (2006.01) |
| *H01L 21/28* | (2006.01) |
| *H01L 29/423* | (2006.01) |
| *H01L 29/78* | (2006.01) |

(52) U.S. Cl.
CPC .............. *H01L 21/823842* (2013.01); *H01L 21/28088* (2013.01); *H01L 21/823821* (2013.01); *H01L 27/0924* (2013.01); *H01L 29/42372* (2013.01); *H01L 29/4966* (2013.01); *H01L 29/7856* (2013.01)

(58) Field of Classification Search
CPC .................................................. H01L 29/7856
USPC .......................................................... 257/406
See application file for complete search history.

(56) References Cited

U.S. PATENT DOCUMENTS

| | | | |
|---|---|---|---|
| 7,485,936 B2 * | 2/2009 | Koyama | ......... H01L 21/823835 257/407 |
| 8,188,547 B2 * | 5/2012 | Manabe | ............ H01L 21/82384 257/406 |
| 8,283,223 B2 | 10/2012 | Iwamoto | |

(Continued)

FOREIGN PATENT DOCUMENTS

| | | |
|---|---|---|
| JP | 2011238655 A | 11/2011 |
| JP | 2012099549 A | 5/2012 |
| KR | 20130022882 A | 3/2013 |

*Primary Examiner* — Chandra Chaudhari
(74) *Attorney, Agent, or Firm* — Myers Bigel, P.A.

(57) ABSTRACT

Semiconductor devices may include a substrate including first to third regions, with first to third interfacial layers in the first to third regions, respectively, first to third high-k dielectric films on the first to third interfacial layers, respectively, first to third work function adjustment films on the first to third high-k dielectric films, respectively, and first to third filling films on the first to third work function adjustment films, respectively. Concentrations of a dipole forming element in the first to third high-k dielectric films may be first to third concentrations. The first concentration may be greater than the second concentration, and the second concentration may be greater than the third concentration. Thicknesses of the first to third work function adjustment films may be first to third thicknesses. The first thickness may be less than the second thickness, and the second thickness may be less than the third thickness.

20 Claims, 20 Drawing Sheets

(56) References Cited

U.S. PATENT DOCUMENTS

| | | | |
|---|---|---|---|
| 8,288,833 B2 | 10/2012 | Matsuyama | |
| 8,357,604 B2 | 1/2013 | Hoentschel et al. | |
| 8,551,832 B2 | 10/2013 | Akiyama et al. | |
| 8,836,046 B2 * | 9/2014 | Maeda | H01L 29/41791 257/401 |
| 9,012,319 B1 | 4/2015 | Choi et al. | |
| 9,064,732 B2 | 6/2015 | Yu et al. | |
| 9,245,759 B2 | 1/2016 | Schram et al. | |
| 2016/0225868 A1 | 8/2016 | Kim et al. | |

* cited by examiner

SEMICONDUCTOR DEVICES AND METHODS FOR FABRICATING THE SAME

CROSS-REFERENCE TO RELATED APPLICATION

This U.S. non-provisional patent application claims priority under 35 U.S.C. § 119 to Korean Patent Application No. 10-2017-0016165 filed on Feb. 6, 2017, in the Korean Intellectual Property Office, the entire contents of which are herein incorporated by reference.

BACKGROUND

1. Technical Field

The present inventive concepts relate to semiconductor devices and methods for fabricating the same.

2. Description of the Related Art

A multigate transistor has been suggested as one of the scaling technologies to increase the density of semiconductor devices, according to which a silicon body in a fin or nanowire shape is formed on a substrate, with gates then being formed on a surface of the silicon body.

Such a multigate transistor may allow for improved scaling, as it uses a three-dimensional channel. Further, current control capability can be enhanced without requiring an increased gate length of the multigate transistor. Furthermore, it may be possible to effectively suppress a short channel effect (SCE), in which the electric potential of a channel region is influenced by a drain voltage.

SUMMARY

It is one technical object of the present inventive concepts to provide semiconductor devices with improved operating characteristics.

It is another technical object of the present inventive concepts to provide methods for fabricating semiconductor devices with improved operating characteristics.

The objects according to the present inventive concepts are not limited to those set forth above and objects other than those set forth above will be clearly understood to a person skilled in the art from the following description.

According to an aspect of the present inventive concepts a semiconductor device may include a substrate including first, second, and third regions, first, second, and third interfacial layers on the substrate in the first to third regions, respectively, first, second, and third high-k dielectric films on the first to third interfacial layers, respectively, first, second, and third work function adjustment films on the first to third high-k dielectric films, respectively, and first, second, and third filling films on the first to third work function adjustment films, respectively. Concentrations of a dipole forming element in the first to third high-k dielectric films may be first, second, and third concentrations, respectively. The first concentration may be greater than the second concentration, and the second concentration may be greater than the third concentration. Thicknesses of the first to third work function adjustment films may be first, second, and third thicknesses, respectively. The first thickness may be less than the second thickness, and the second thickness may be less than the third thickness.

According to another aspect of the present inventive concepts, a semiconductor device may include a substrate comprising an n-type region and a p-type region, where the n-type region includes first, second, and third regions and the p-type region includes fourth, fifth, and sixth regions, first, second, third, fourth, fifth, and sixth interfacial layers on the first to sixth regions, respectively, of the substrate, first, second, third, fourth, fifth, and sixth high-k dielectric films on the first to sixth interfacial layers, respectively, first, second, and third work function adjustment films on the first to third high-k dielectric films, and fourth, fifth, and sixth work function adjustment films on the fourth to sixth high-k dielectric films. A concentration of a dipole forming element in the first and fourth high-k dielectric films may be a first concentration, a concentration of the dipole forming element in the second and fifth high-k dielectric films may be a second concentration, a concentration of the dipole forming element in the third and sixth high-k dielectric films may be a third concentration. The first concentration may be greater than the second concentration, and the second concentration may be greater than the third concentration. Thicknesses of the first to third work function adjustment films may be first, second, and third thicknesses, respectively. The first thickness may be less than the second thickness, and the second thickness may be less than the third thickness. Thicknesses of the fourth to sixth work function adjustment films may be fourth, fifth, and sixth thicknesses. The fourth thickness may be less than the fifth thickness, and the fifth thickness may be less than the sixth thickness.

According to another aspect of the present inventive concepts, a semiconductor device may include a substrate, a first fin structure protruding from a first region of the substrate, a second fin structure protruding from a second region of the substrate, a third fin structure protruding from a third region of the substrate, a first gate structure on the first fin structure, a second gate structure on the second fin structure, and a third gate structure on the third fin structure. The first gate structure may include a first dielectric film including a first concentration of a dipole forming element and a first work function adjustment film having a first thickness. The second gate structure may include a second dielectric film including a second concentration of the dipole forming element and a second work function adjustment film having a second thickness. The third gate structure may include a third dielectric film comprising a third concentration of the dipole forming element and a third work function adjustment film having a third thickness. The first concentration of the dipole forming element may be greater than the second concentration of the dipole forming element. The second concentration of the dipole forming element may be greater than the third concentration of the dipole forming element. The first thickness may be smaller than the second thickness. The second thickness may be smaller than the third thickness.

BRIEF DESCRIPTION OF THE DRAWINGS

The above and other objects, features and advantages of the present inventive concepts will become more apparent to those of ordinary skill in the art by describing in detail example embodiments thereof with reference to the accompanying drawings.

DETAILED DESCRIPTION

Hereinafter, a semiconductor device according to some example embodiments of the present inventive concepts will be described with reference to FIGS. 1 to 4.

Figure 1:
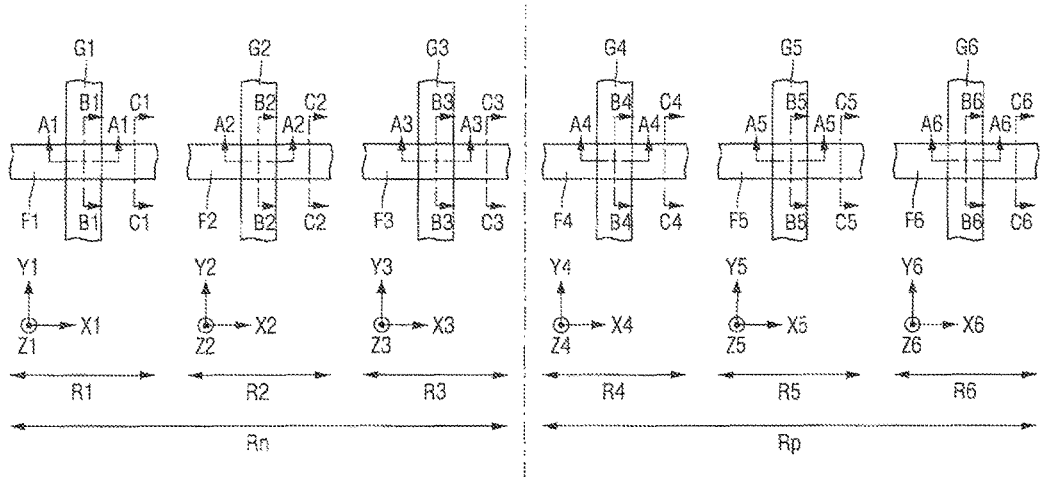
FIG. 1 is a layout diagram of a semiconductor device according to some example embodiments of the present inventive concepts.
Figure 2:
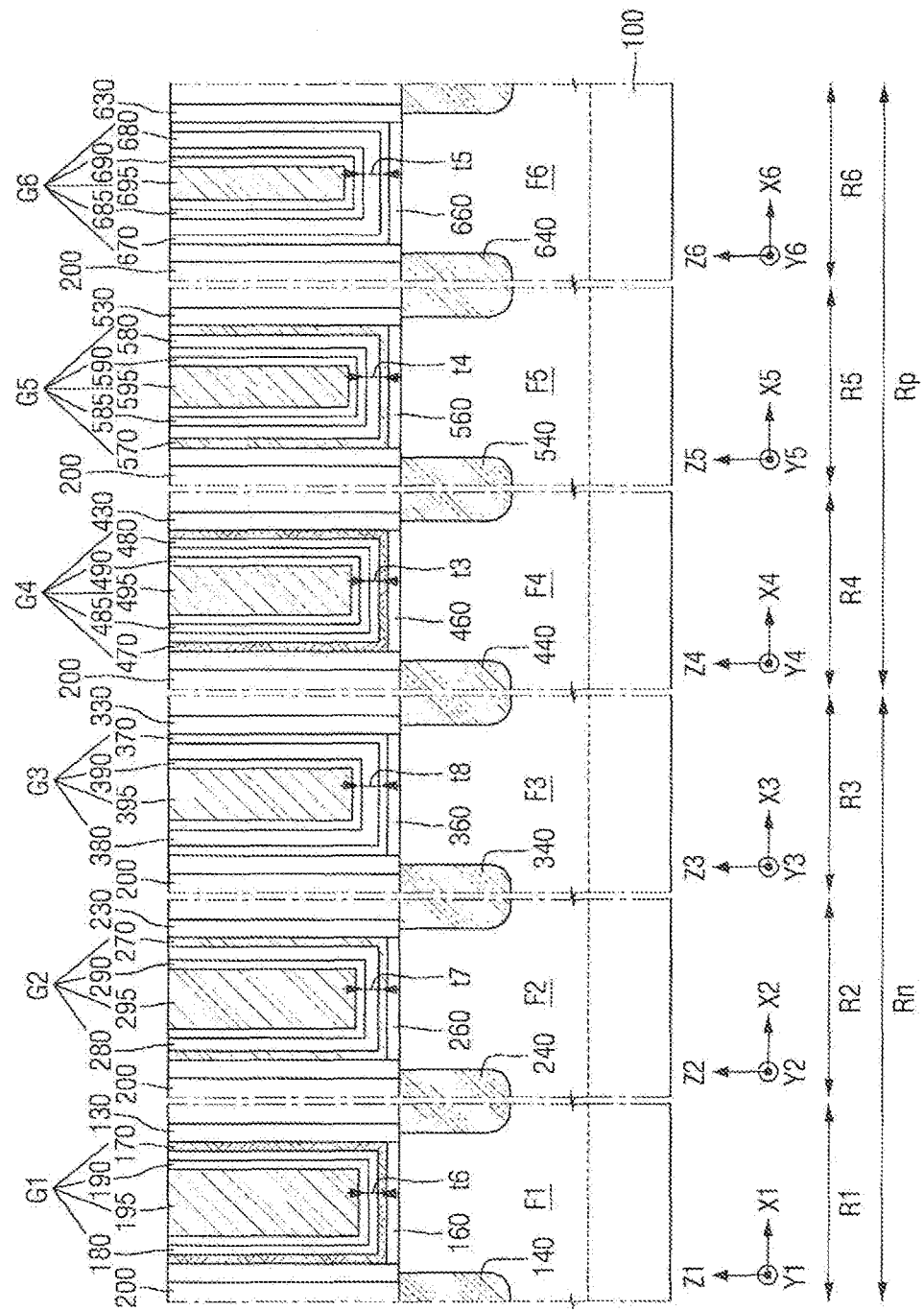
FIG. 2 is a cross-sectional view taken on lines A1-A1, A2-A2, A3-A3, A4-A4, A5-A5 and A6-A6 of FIG. 1.
Figure 3:
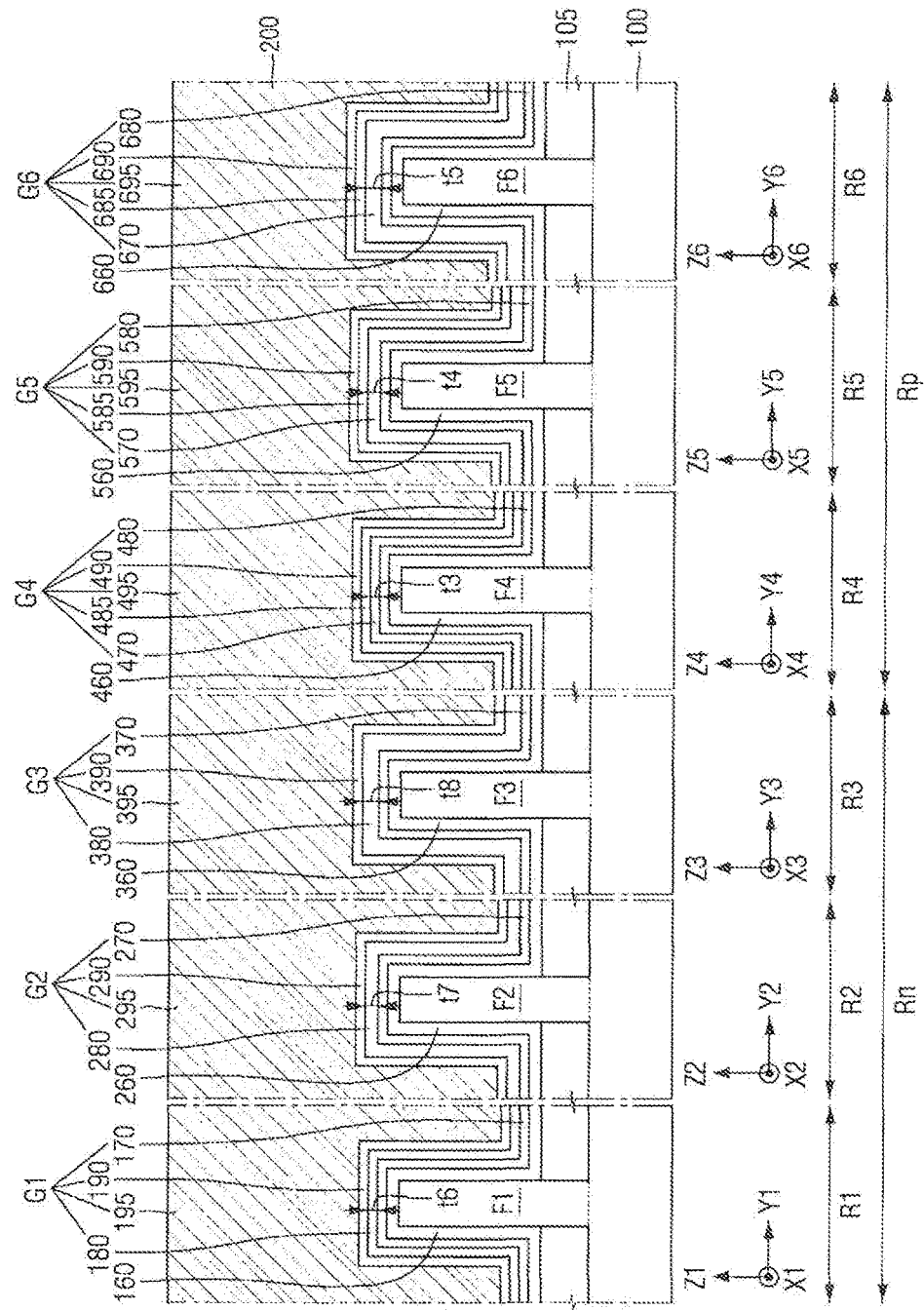
FIG. 3 is a cross-sectional view taken on lines B1-B1, B2-B2, B3-B3, B4-B4, B5-B5, and B6-B6 of FIG. 1.
Figure 4:
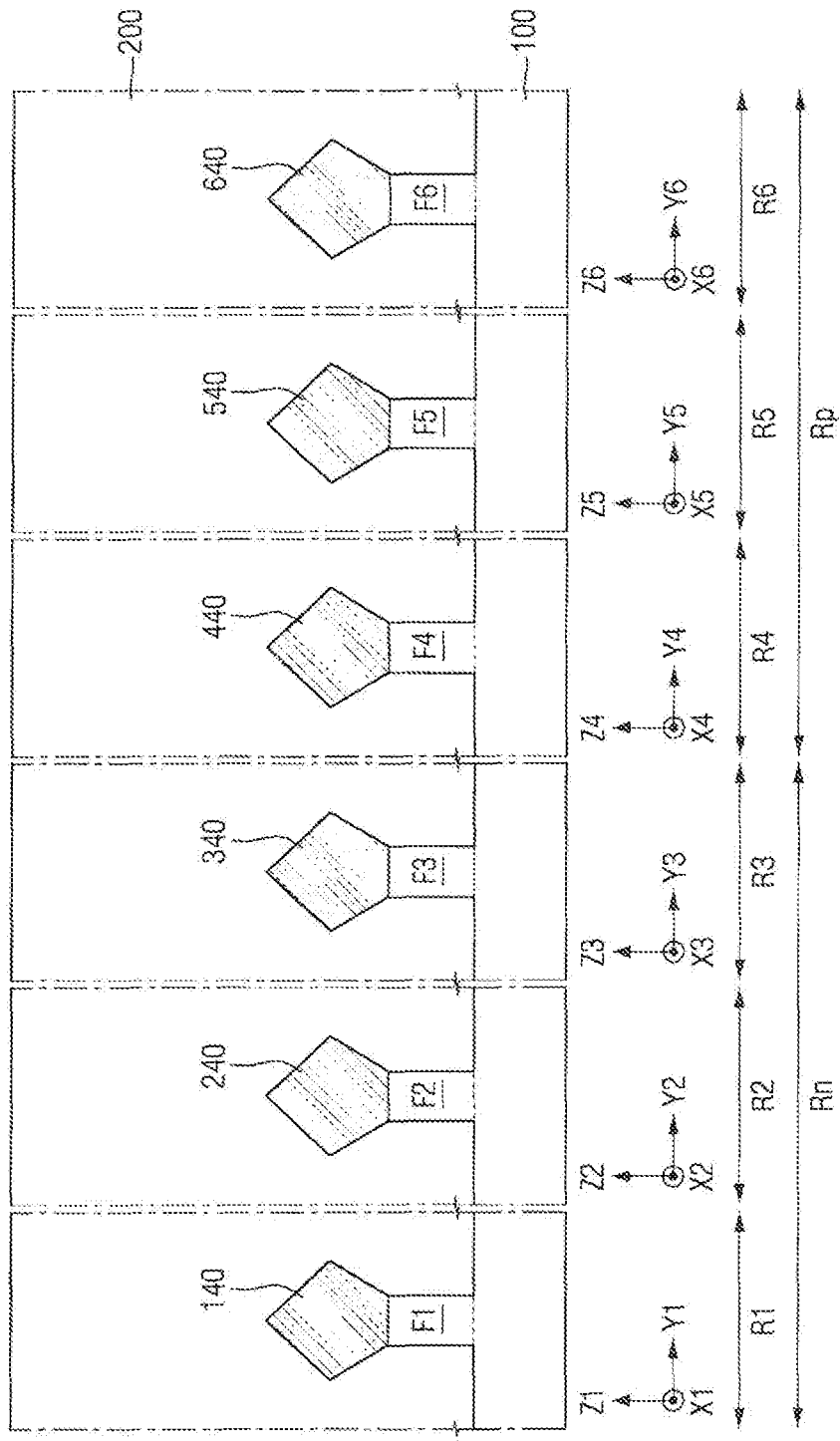
FIG. 4 is a cross-sectional view taken on lines C1-C1, C2-C2, C3-C3, C4-C4, C5-C5, and C6-C6 of FIG. 1.

FIG. 1 is a layout diagram of a semiconductor device according to some example embodiments of the present inventive concepts, and FIG. 2 is a cross-sectional view taken on lines A1-A1, A2-A2, A3-A3, A4-A4, A5-A5, and A6-A6 of FIG. 1. FIG. 3 is a cross-sectional view taken on lines B1-B1, B2-B2, B3-B3, B4-B4, B5-B5, and B6-B6 of FIG. 1, and FIG. 4 is a cross-sectional view taken on lines C1-C1, C2-C2, C3-C3, C4-C4, C5-C5 and C6-C6 of FIG. 1.

Referring to FIGS. 1 to 4, the semiconductor device according to some example embodiments of the present inventive concepts may include a substrate 100, first to sixth fins F1-F6, a field insulating film 105, first to sixth gate structures G1-G6, first to sixth spacers 130, 230, 330, 430, 530, 630 (denoted herein as "130-630" for brevity), first to sixth source/drains 140, 240, 340, 440, 540, 640 (denoted herein as "140-640" for brevity), and an interlayer insulating film 200.

The substrate 100 may include an n-type region Rn and a p-type region Rp. In some embodiments, the n-type region Rn may be an n-type portion of the substrate, and the p-type region Rp may be a p-type portion of the substrate. As will be further explained below, an NMOS transistor may be formed in the n-type region Rn, and a PMOS transistor may be formed in the p-type region Rp. The n-type region Rn and the p-type region Rp may be adjacent to each other, or may be spaced apart from each other.

The n-type region Rn may include first to third regions R1-R3. The first to third regions R1-R3 may be adjacent to one another, or may be spaced apart from one another. The first to third regions R1-R3 may be respectively disposed in different directions from one another, or may be disposed in the same direction.

Specifically, the first region R1 may be defined in a first X direction X1, a first Y direction Y1, and a first Z direction Z1, which are perpendicular to one another. The second region R2 may be defined in a second X direction X2, a second Y direction Y2, and a second Z direction Z2, which are perpendicular to one another. The third region R3 may be defined with a third X direction X3, a third Y direction Y3, and a third Z direction 73, which are perpendicular to one another. In an example, the first to third X directions X1-X3, the first to third Y directions Y1-Y3, and the first to third Z directions Z1-Z3 may be the same direction as one another, respectively, or may be different directions from one another.

The p-type region Rp may include fourth to sixth regions R4-R6. The fourth to sixth regions R4-R6 may be adjacent to one another, or may be spaced apart from one another. The fourth to sixth regions R4-R6 may be respectively disposed in different directions from one another, or may be disposed in the same direction.

Specifically, the fourth region R4 may be defined in a fourth X direction X4, a fourth Y direction Y4, and a fourth Z direction Z4, which are perpendicular to one another. The fifth region R5 may be defined in a fifth X direction X5, a fifth Y direction Y5, and a fifth Z direction Z5, which are perpendicular to one another. The sixth region R6 may be defined with a sixth X direction X6, a sixth Y direction Y6, and a sixth Z direction Z6, which are perpendicular to one another. In an example, the fourth to sixth X directions X4-X6, the fourth to sixth Y directions Y4-Y6, and the fourth to sixth Z directions Z4-Z6 may be the same direction as one another, respectively, or different directions from one another.

The substrate 100 may be formed of one or more semiconductor materials selected from a group consisting of, for example, Si, Ge, SiGe, GaP, GaAs, SiC, SiGeC, InAs and/or InP. Further, a silicon on insulator (SOI) substrate may be used.

The first to sixth fins F1-F6 may be formed respectively protruding from the substrate 100 in the first to sixth regions R1-R6 in the first to sixth Z directions Z1-Z6. In an example, the first to sixth Z directions Z1-Z6 may all be the same vertical direction.

The first to sixth fins F1-F6 may extend in the first to sixth regions R1-R6 in the first to sixth X directions X1-X6. The first to sixth fins F1-F6 may have a long side and a short side. Although FIG. 1 illustrates long side directions extending respectively in the first to sixth X directions X1-X6 and short side directions extending respectively in the first to sixth Y directions Y1-Y6, the example embodiments of the present inventive concepts are not limited thereto.

The first to sixth fins F1-F6 may be a part of the substrate 100 and/or may include an epitaxial layer grown from the substrate 100. For example, the first to sixth fins F1-F6 may include Si or SiGe.

Further, the first to sixth fins F1-F6 may include a compound semiconductor, such as a Group IV-IV compound semiconductor or a Group III-V compound semiconductor, for example.

If the first to sixth fins F1-F6 include the Group IV-IV compound semiconductor, for example, the first to sixth fins F1-F6 may be a binary compound or a ternary compound including at least two of carbon (C), silicon (Si), germanium (Ge) and tin (Sn), and/or these compounds doped with Group IV element.

If the first to sixth fins F1-F6 include the Group III-V compound semiconductor, for example, the first to sixth fins F1-F6 may be any one of a binary compound, a ternary compound, or a quaternary compound formed by combining at least one of the Group III elements which may be aluminum (Al), gallium (Ga) and/or indium (In) with at least one of the Group V elements which may be phosphorous (P), arsenic (As) and/or antimony (Sb).

In semiconductor devices according to example embodiments of the present inventive concepts, the first to sixth fins F1-F6 may include silicon.

The field insulating film 105 may be formed on the substrate 100, may partially cover a portion of a sidewall of the first to sixth fins F1-F6, and may expose an upper portion of the first to sixth fins F1-F6. For example, the field insulating film 105 may include at least one of silicon oxide, silicon nitride, silicon oxynitride, and/or a low-k dielectric material with a lower dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, and/or a combination thereof, but the present inventive concepts are not limited thereto.

The first to sixth gate structures G1-G6 may respectively intersect the first to sixth fins F1-F6 on the first to sixth fins F1-F6. Although FIG. 1 illustrates that the first to sixth gate structures G1-G6 extend in the first to sixth Y directions Y1-Y6, example embodiments of the present inventive concepts are not be limited thereto. Accordingly, the first to sixth gate structures G1-G6 may respectively intersect the first to sixth fins F1-F6 by forming an acute angle or an obtuse angle on a plane view.

First to sixth interfacial layers 160, 260, 360, 460, 560, 660 (denoted herein as "160-660" for brevity) may be respectively formed between the substrate 100 and the first to sixth gate structures G1-G6. The first to sixth interfacial layers 160-660 may be respectively formed by oxidizing a portion of the first to sixth fins F1-F6. The first to sixth interfacial layers 160-660 may be formed along a profile of the first to sixth fins F1-F6 protruding upward higher than an upper surface of the field insulating film 105. When the first to sixth fins F1-F6 are a silicon fin-type pattern including silicon, the first to sixth interfacial layers 160-660 may include a silicon oxide film.

Although FIG. 3 illustrates that the first to sixth interfacial layers 160-660 are formed along the upper surface of the field insulating film 105, example embodiments of the present inventive concepts are not limited thereto. Depending on a method of forming the first to sixth interfacial layers 160-660, the first to sixth interfacial layers 160-660 may not be formed along the upper surface of the field insulating film 105.

First to sixth high-k dielectric films 170, 270, 370, 470, 570, 670 (denoted herein as "170-670" for brevity) may be part of the first to sixth gate structures G1-G6 respectively adjacent the first to sixth interfacial layers 160-660. The first to sixth high-k dielectric films 170-670 may be formed along a profile of the first to sixth fins F1-F6 protruding upward higher than the upper surface of the field insulating film 105. Further, the first to sixth high-k dielectric films 170-670 may be part of the first to sixth gate structures G1-G6 respectively adjacent the field insulating film 105. In some embodiments, the first to sixth interfacial layers 160-660 may be between the first to sixth high-k dielectric films 170-670 and the field insulating film 105.

The first to sixth high-k dielectric films 170-670 may be respectively formed along upper surfaces of the first to sixth interfacial layers 160-660 and inner side surfaces of the first to sixth spacers 130-630. Accordingly, the uppermost portions of the first to sixth high-k dielectric films 170-670 may have the same height as the upper surfaces of the first to sixth spacers 130-630.

The first to sixth high-k dielectric films 170-670 may include a high-k dielectric material having a higher dielectric constant than the silicon oxide film. For example, the first to sixth high-k dielectric films 170-670 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but the present inventive concepts are not limited thereto.

In some embodiments, the first to sixth high-k dielectric films 170-670 may include a dipole forming element. In some embodiments, the dipole forming element may be at least one of La, Nd, Eu, Dy, Ho and/or Yb. However, embodiments of the present inventive concepts are not limited thereto.

The concentrations of the dipole forming element in the first to sixth high-k dielectric films 170-670 may be first to sixth concentrations, respectively. In some embodiments, the first and fourth concentrations may be substantially the same as each other, the second and fifth concentrations may be substantially the same as each other, and the third and sixth concentrations may be substantially the same as each other. Because the same concentration may be obtained through a same diffusion process, a concept of "same" is defined herein as including fine differences that may occur among the processes.

In some embodiments, the first concentration may be greater than the second concentration, and the second concentration may be greater than the third concentration. Likewise, the fourth concentration may be greater than the fifth concentration, and the fifth concentration may be greater than the sixth concentration.

The third and sixth concentrations may be 0. That is, the third high-k dielectric film 370 and the sixth high-k dielectric film 670 may not include the dipole forming element at all. However, embodiments of the present inventive concepts are not limited thereto. Accordingly, in semiconductor devices according to some embodiments of the present inventive concepts, the third and sixth concentrations may not be 0, but may be lower concentrations than the first, second, fourth, and fifth concentrations.

The first to sixth gate structures G1-G6 may be formed as multi-layered films. Specifically, the first gate structure G1 may include the first high-k dielectric film 170, a first lower work function adjustment film 180, a first upper work function adjustment film 190, and a first filling film 195. The second gate structure G2 may include the second high-k dielectric film 270, a second lower work function adjustment film 280, a second upper work function adjustment film 290, and a second filling film 295. The third gate structure G3 may include the third high-k dielectric film 370, a third lower work function adjustment film 380, a third upper work function adjustment film 390, and a third filling film 395.

The fourth gate structure G4 may include the fourth high-k dielectric film 470, a fourth lower work function adjustment film 480, a first intermediate work function adjustment films 485, a fourth upper work function adjustment film 490, and a fourth filling film 495. The fifth gate structure G5 may include the fifth high-k dielectric film 570, a fifth lower work function adjustment film 580, a second intermediate work function adjustment film 585, a fifth upper work function adjustment film 590, and a fifth filling film 595. The sixth gate structure G6 may include the sixth high-k dielectric film 670, a sixth lower work function adjustment film 680, a third intermediate work function adjustment film 685, a sixth upper work function adjustment film 690, and a sixth filling film 695.

The first to sixth lower work function adjustment films 180, 280, 380, 480, 580, 680 (denoted herein as "180-680"

for brevity) may be respectively formed on upper surfaces of the first to sixth high-k dielectric films 170-670.

The first to third lower work function adjustment films 180, 280, 380 (denoted herein as "180-380" for brevity) may have sixth to eighth thicknesses t6-t8. In some embodiments, the sixth thickness t6 may be less than the seventh thickness t7, and the seventh thickness may be less than the eighth thickness t8. The thicknesses provided above may be related with the concentrations of the dipole forming element in the first to third high-k dielectric films 170, 270, 370 (denoted herein as "170-370" for brevity). That is, the concentrations of the dipole forming element in the first to third high-k dielectric films 170-370 may be first to third concentrations, respectively, among which the first concentration may be highest and the third concentration may be lowest. Accordingly, the first to third lower work function adjustment films 180-380 may be formed with different thicknesses even when they are formed for the same duration of time in the forming process.

That is, according to the concentration of the dipole forming element in the high-k dielectric film positioned adjacent, thicknesses of the first to third lower work function adjustment films 180-380 may be varied. Specifically, as the concentration of the dipole forming element in the high-k dielectric film positioned adjacent is increased, thicknesses of the first to third lower work function adjustment films 180-380 may be decreased.

The fourth to sixth lower work function adjustment films 480, 580, 680 (denoted herein as "480-680" for brevity) may respectively have third to fifth thicknesses t3-t5. In an example, the third thickness t3 may be less than the fourth thickness t4, and the fourth thickness t4 may be less than the fifth thickness t5. Again, the thicknesses provided above may be related with the concentrations of the dipole forming element in the fourth to sixth high-k dielectric films 470, 570, 670 (denoted herein as "470-670" for brevity). That is, the concentrations of the dipole forming element in the fourth to sixth high-k dielectric films 470-670 may be fourth to sixth concentrations, respectively, among which the fourth concentration may be greatest and the sixth concentration may be lowest. Accordingly, the fourth to sixth lower work function adjustment films 480-680 may be formed with different thicknesses even when they are formed for the same duration of time in the forming process.

That is, according to the concentration of the dipole forming element in the high-k dielectric film positioned adjacent, thicknesses of the fourth to sixth lower work function adjustment films 480-680 may be varied. Specifically, as the concentration of the dipole forming element in the high-k dielectric film positioned adjacent is increased, thicknesses of the fourth to sixth lower work function adjustment films 480-680 may be decreased.

The fourth to sixth lower work function adjustment films 480-680 may include a p-type work function adjustment material. That is, the fourth to sixth lower work function adjustment films 480-680 may serve as the work function adjustment film that forms PMOS. That is, threshold voltages Vt of the transistors in the fourth region R4 to the sixth region R6 may be adjusted by the fourth to sixth lower work function adjustment films 480-680.

The fourth to sixth lower work function adjustment films 480-680 may include at least one of TiN or TaN. However, embodiments of the present inventive concepts are not limited thereto.

The first to third intermediate work function adjustment films 485, 585, 685 (denoted herein as "485-685" for brevity) may be formed on the fourth to sixth lower work function adjustment films 480-680, respectively. The first to third intermediate work function adjustment films 485-685 may all be formed with the same thickness.

The first to third intermediate work function adjustment films 485-685 may be the same material as the first to third lower work function adjustment films 180-380. That is, the first to third intermediate work function adjustment films 485-685 and the first to third lower work function adjustment films 180-380 may be formed by the same process. Note that different thicknesses may be obtained even in the same process according to whether there are the first to third high-k dielectric films 170-370 below and whether there are the fourth to sixth lower work function adjustment films 480-680 below.

The first to third intermediate work function films 485-685 may include at least one of TiN or TaN. However, example embodiments of the present inventive concepts are not limited thereto.

The first to third intermediate work function adjustment films 485-685 and the first to third lower work function adjustment films 180-380 may serve as a barrier film. That is, the first to third intermediate work function adjustment films 485-685 and the first to third lower work function adjustment films 180-380 may serve to prevent the first to sixth upper work function adjustment films 190, 290, 390, 490, 590, 690 (denoted herein as "190-690" for brevity), which will be formed later, from contacting the first to sixth high-k dielectric films 170-670, respectively. As a result, they may play a role of preventing materials of the first to sixth upper work function adjustment films 190-690 from being diffused into the first to sixth high-k dielectric films 170-670.

The first to third upper work function adjustment films 190, 290, 390 (denoted herein as "190-390" for brevity) may be formed on the first to third lower work function adjustment films 180-380, respectively. The first to third upper work function adjustment films 190-390 may be formed with substantially the same thickness.

The fourth to sixth upper work function adjustment films 490, 590, 690 (denoted herein as "490-690" for brevity) may be formed on the first to third intermediate work function adjustment films 485-685, respectively. The fourth to sixth upper work function adjustment films 490-690 may be formed with substantially the same thickness.

The first to sixth upper work function adjustment films 190-690 may all include the same material. The first to sixth upper work function adjustment films 190-690 may be an n-type work function adjustment material. For example, the first to sixth upper work function adjustment films 190-690 may include TiAlC, but the present inventive concepts are not limited thereto.

That is, the transistor formed in the n-type region Rn may include an n-type work function adjustment material, and the transistor formed in the p-type region Rp may include both a p-type work function adjustment material and an n-type work function adjustment material.

The first to sixth filling films 195, 295, 395, 495, 595, 695 (denoted herein as "195-695" for brevity) may be formed on the first to sixth upper work function adjustment films 190-690, respectively. The first to sixth filling films 195-695 may complete the first to sixth gate structures G1-G6. The first to sixth filling films 195-695 may include at least one of W or TiN, but the present inventive concepts are not limited thereto.

The first to sixth spacers 130-630 may be disposed respectively on the sidewalls of the first to sixth gate structures G1-G6 extending in the first to sixth Y directions Y1-Y6. For example, the first to sixth spacers 130-630 may include at least one of silicon nitride (SiN), silicon oxynitride (SiON), silicon oxide (SiO$_2$), silicon oxycarbonitride (SiOCN), and/or a combination thereof.

As exemplified in the drawings, the first to sixth spacers 130-630 may be a single-layered film, but may also be a multi-spacer in which a plurality of films are stacked. Shapes of the first to sixth spacers 130-630 and shapes of the multi-spacers forming the first to sixth spacers 130-630 may each be I- or L-shape, or a combination thereof depending on the fabrication process or purpose of use.

The first to sixth source/drains 140-640 may be respectively formed on both sides of the first to sixth gate structures G1-G6. The first to sixth source/drains 140-640 may include an epitaxial layer formed by epitaxy. In some embodiments, the first to sixth source/drains 140-640 may be elevated source/drains. The first to third source/drains 140, 240, 340 positioned in the n-type region Rn may be, for example, a Si-epitaxial layer and/or a SiC-epitaxial layer. In some embodiments, the first to third source/drains 140, 240, 340 may include Si:P highly doped with P, or SiPC. The fourth to sixth source/drains 440, 540, 640 positioned in the p-type region Rp may be, for example, a SiGe epitaxial layer.

An outer circumference of the first to sixth source/drains 140-640 may have at least one of diamond, circle and/or rectangle shapes. FIG. 4 illustrates a diamond shape (or pentagon or hexagon shape), for example, though the present inventive concepts are not limited thereto.

In the semiconductor device according to some exemplary embodiments, the first to sixth source/drains 140-640 in the n-type region Rn and the p-type region Rp may have different shapes, sizes and/or compositions from each other.

The interlayer insulating film 200 may overlie the first to sixth gate structures G1-G6 and the first to sixth spacers 130-630. For example, the interlayer insulating film 200 may include at least one of silicon oxide, silicon nitride, silicon oxynitride, and/or a low-k dielectric material with a lower dielectric constant than silicon oxide.

The first to sixth regions R1-R6 of the semiconductor device according to some example embodiments of the present inventive concepts may have different threshold voltages from one another. In the n-type region Rn, the transistor of the first region R1 having the first high-k dielectric film 170 with the highest concentration of the dipole forming element may have a lowest threshold voltage (SLVTN: super low threshold voltage n-type transistor), the transistor of the second region R2 having the second high-k dielectric film 270 with the second highest concentration may have a second lowest threshold voltage (LVTN: low threshold voltage n-type transistor), and finally, the transistor of the third region R3 having the third high-k dielectric film 370 may have a highest threshold voltage (RVTN: regular threshold voltage n-type transistor).

In the p-type region, the transistor of the fourth region R4 having the fourth high-k dielectric film 470 with a highest concentration of the dipole forming element may have a highest threshold voltage (RVTP: regular threshold voltage p-type transistor), the transistor of the fifth region R5 having the fifth high-k dielectric film 570 with the second highest concentration may have a second highest threshold voltage (LTVP: low threshold voltage p-type transistor), and finally, the transistor of the sixth region R6 having the sixth high-k dielectric film 670 may have a lowest threshold voltage (SLVTP: super low threshold voltage p-type transistor).

Because conventional multi threshold voltage devices adjust a threshold voltage with a thickness of the work function adjustment film, the number of processes for repeatedly forming the work function adjustment film may be different depending on regions. This may result in more complicated processes for the related multi threshold voltage devices, and possible deterioration of the characteristics due to impurities such as an oxide film on a surface of the interface between each of the work function adjustment films. Further, as the overall thickness of the work function adjustment film increases, removal of the work function adjustment film may be difficult in a removal process which is selectively applied to the n-type region and the p-type region.

Conversely, because the semiconductor devices according to example embodiments of the present inventive concepts implement a multi threshold voltage device according to a concentration of the dipole forming element, the manufacturing process can become simpler, and removal of the work function adjustment film can also be facilitated. Accordingly, the overall reliability and operating characteristics of the semiconductor device can be significantly enhanced.

A semiconductor device according to some example embodiments of the present inventive concepts will be described with reference to FIG. 5. Elements or operations overlapping with some example embodiments described above will be mentioned as briefly as possible or omitted for the sake of brevity.

Figure 5:
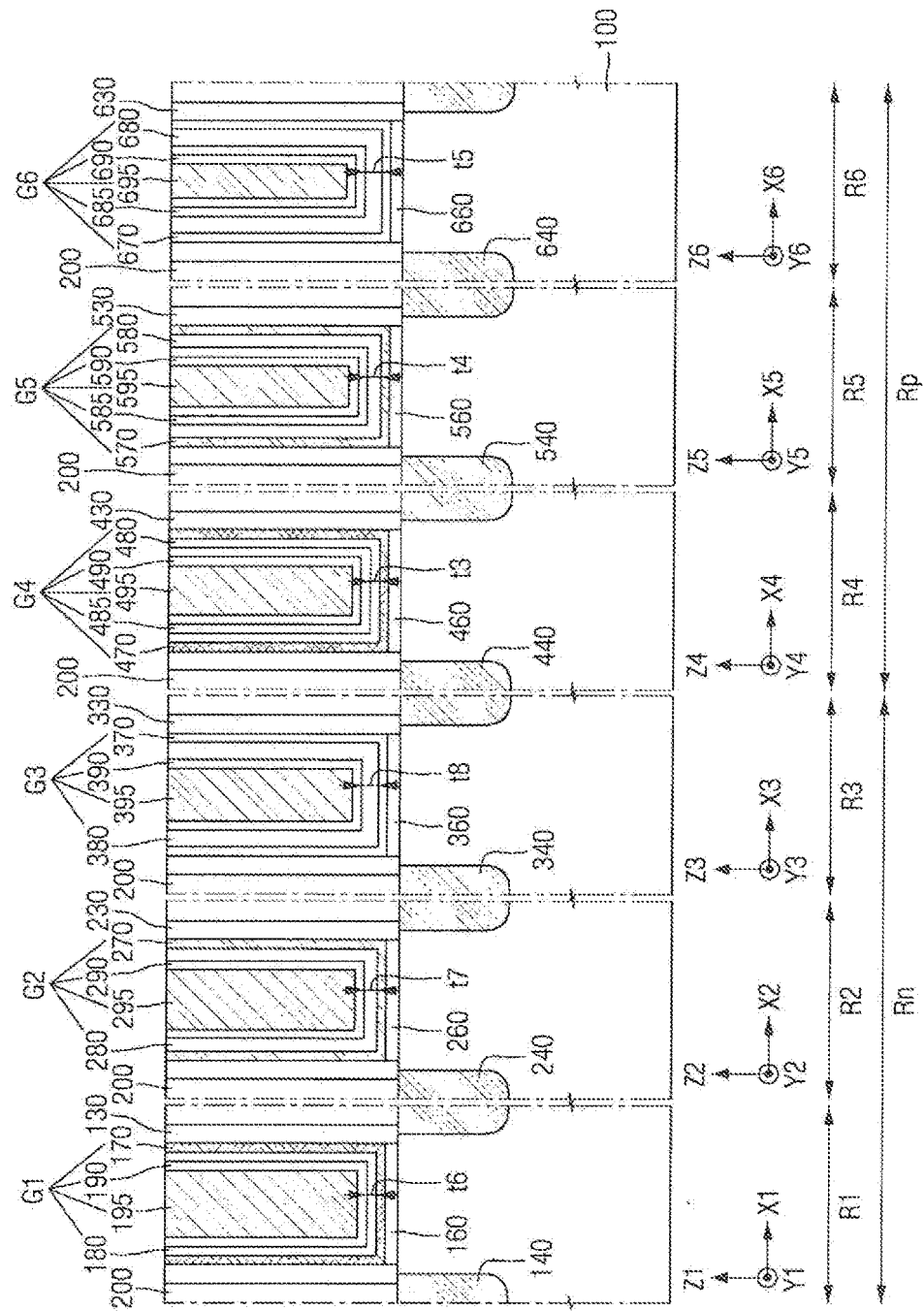
FIG. 5 is a cross-sectional view of a semiconductor device according to some example embodiments of the present inventive concepts.

FIG. 5 is a cross-sectional view of a semiconductor device according to some example embodiments of the present inventive concepts. FIG. 5 illustrates a cross-sectional view of a gate structure according to some example embodiments taken on similar lines as that of FIG. 2 (e.g. A1-A1, A2-A2, A3-A3, A4-A4, A5-A5, and A6-A6 of FIG. 1).

Referring to FIG. 5, in the semiconductor device according to some embodiments, the first to sixth fins F1-F6 may not be formed, but the first to sixth gate structures G1-G6 may be formed immediately on the substrate 100.

Accordingly, a field insulating film (e.g. field insulating film 105 of FIG. 3) may not be necessary according to some embodiments of the present inventive concepts. In some embodiments, a gate first process may be performed instead of a gate last process. When the first to sixth gate structures G1-G6 are formed with the gate first process, shapes of the first to sixth high-k dielectric film 170-670, the first to sixth lower work function adjustment films 180-680, the first to sixth upper work function adjustment films 190-690, and the first to third intermediate work function adjustment films 485-685 may be a flat shape instead of the U shape illustrated in FIG. 5.

A semiconductor device according to some example embodiments of the present inventive concepts will be described with reference to FIG. 6. Elements or operations overlapping with some exemplary embodiments described above will be mentioned as briefly as possible or omitted for the sake of brevity.

Figure 6:
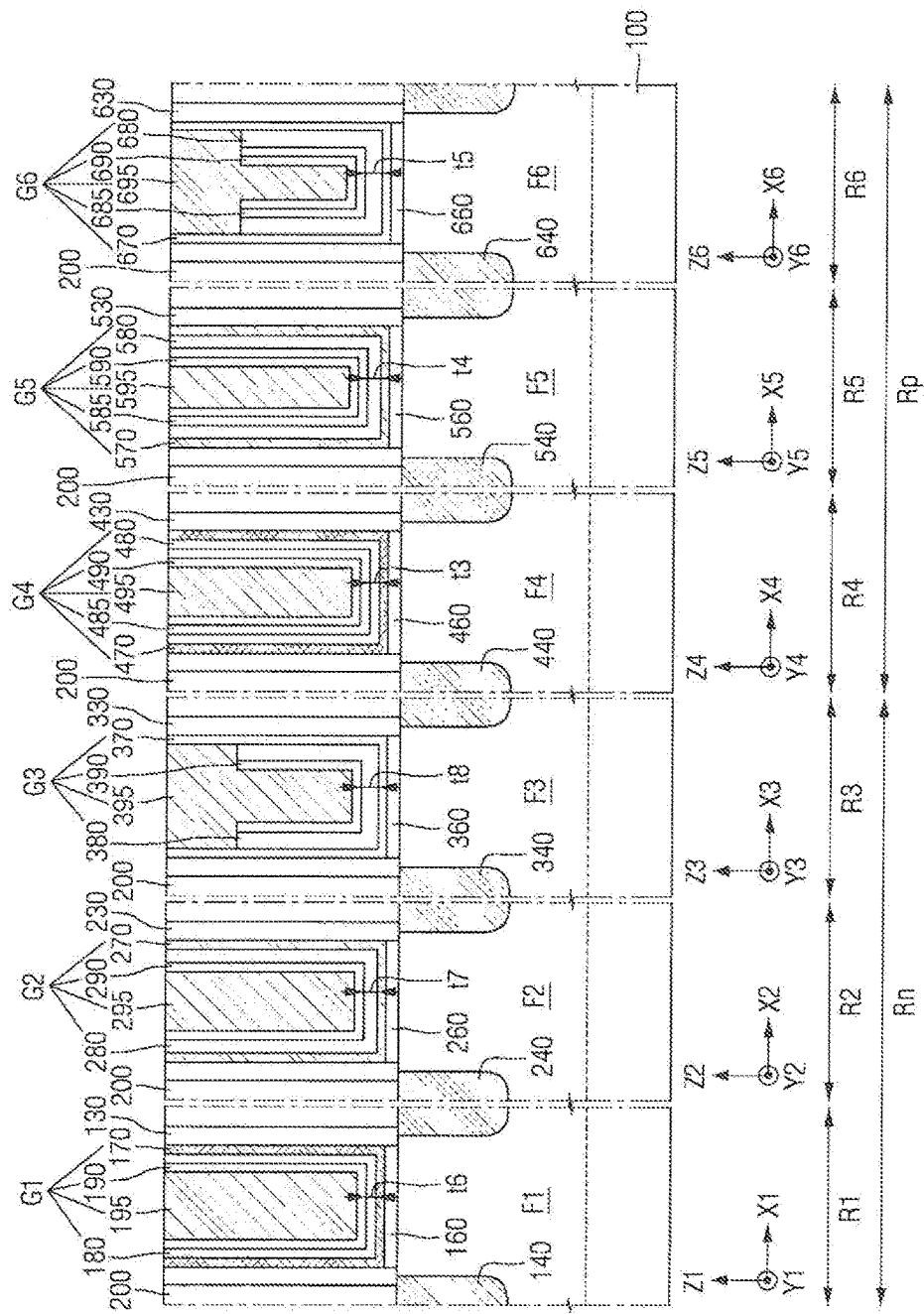
FIG. 6 is a cross-sectional view of a semiconductor device according to some example embodiments of the present inventive concepts.

FIG. 6 is a cross-sectional view of a semiconductor device according to some example embodiments of the present inventive concepts. FIG. 6 illustrates a cross-sectional view of a gate structure according to some example embodiments taken on similar lines as that of FIG. 2 (e.g. A1-A1, A2-A2, A3-A3, A4-A4, A5-A5, and A6-A6 of FIG. 1).

Referring to FIG. 6, the gate structures of some regions in the semiconductor device according to some example embodiments may include a chamfered shape.

As exemplified in FIG. 6, the third gate structure G3 and the sixth gate structure G6 of the third region R3 and the sixth region R6 may respectively include a chamfered shape. However, example embodiments of the present inventive concepts are not limited thereto. Accordingly, any region may include a chamfered shape as described herein, as need arises according to a width of the gate structure or for other reasons in the manufacturing process.

Specifically, when a thick work function adjustment film such as the third lower work function adjustment film 380 and/or the sixth lower work function adjustment film 680 is used, it may be difficult for all the multi-layered films to be shaped in a U shape. Accordingly, a stack structure of the gate structure may be formed in the chamfered shape. In some embodiments, a result of the chamfered shape may be that the height of the third lower work function adjustment film 380 and/or the third upper work function adjustment film 390 may be less than the height of the third high-k dielectric film 370. Similarly, in some embodiments, a result of the chamfered shape may be that the height of the sixth lower work function adjustment film 680, the third intermediate work function adjustment film 685, and/or the sixth upper work function adjustment film 690 may be less than the height of the sixth high-k dielectric film 670. According to the present inventive concepts, as long as an order of the films forming the gate structure is constructed as described herein, a stack shape of the gate structure is not limited.

Methods for fabricating semiconductor devices according to some example embodiments of the present inventive concepts will be explained with reference to FIGS. 2 and 7 to 19. FIGS. 7 to 19 represent cross-sectional views taken on lines A1-A1, A2-A2, A3-A3, A4-A4, A5-A5 and A6-A6 as illustrated in FIG. 1. Elements or operations overlapping with some example embodiments described above will be mentioned as briefly as possible or omitted for the sake of brevity.

FIGS. 7 to 19 are views illustrating stages of fabrication of a method for fabricating semiconductor devices according to some example embodiments of the present inventive concepts.

Figure 7:
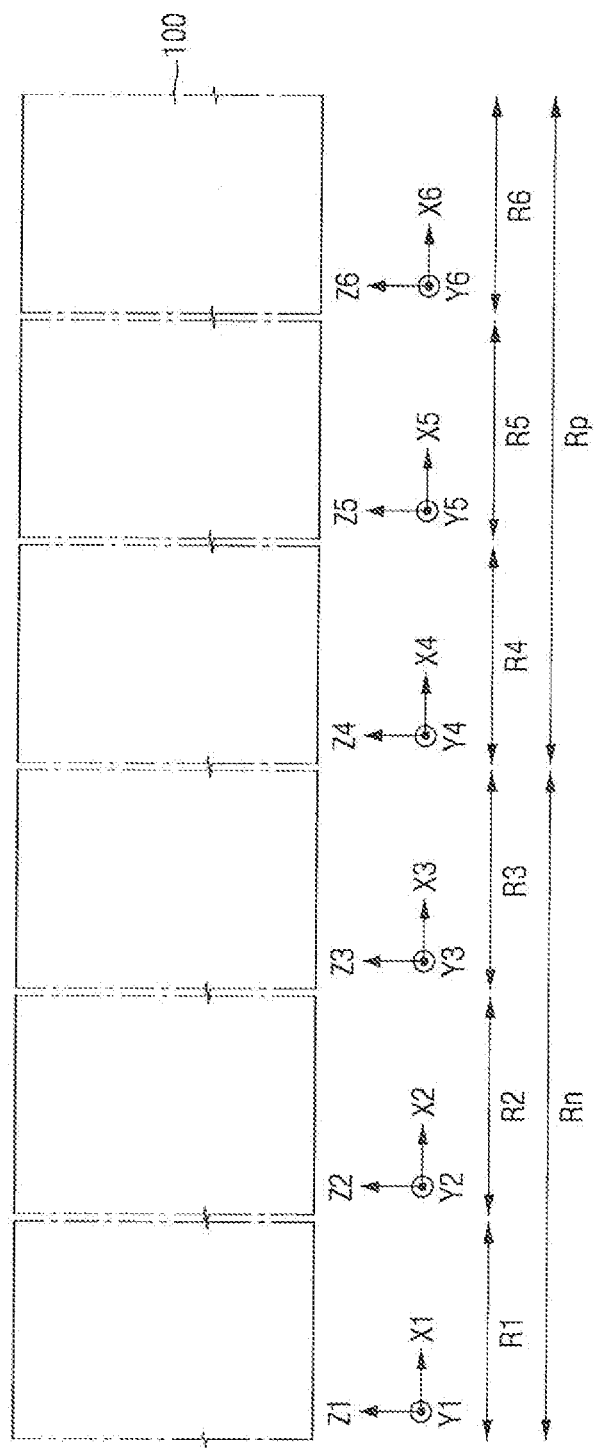
FIGS. 7 to 19 are views illustrating stages of fabrication of a method for fabricating semiconductor devices according to some example embodiments of the present inventive concepts.

Referring first to FIG. 7, the substrate 100 is provided. The substrate 100 may include an n-type region Rn and a p-type region Rp. As will be further explained below, an NMOS transistor may be formed in the n-type region Rn, and a PMOS transistor may be formed in the p-type region Rp. The n-type region Rn and the p-type region Rp may be adjacent to each other, or may be spaced apart from each other.

The n-type region Rn may include first to third regions R1-R3. The first to third regions R1-R3 may be adjacent to one another, or may be spaced apart from one another. The first to third regions R1-R3 may be respectively disposed in different directions from one another, or may be disposed in the same direction as one another.

Figure 8:
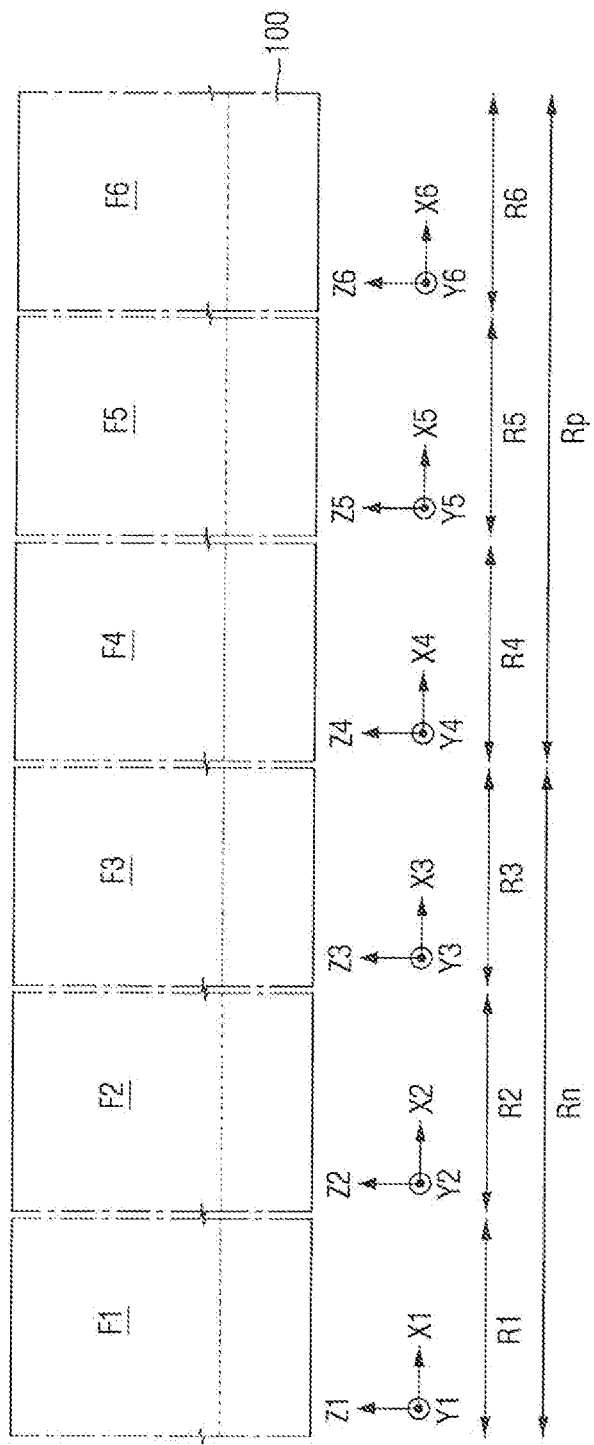

Next, referring to FIG. 8, the first to sixth fins F1-F6 are formed in the first to sixth regions R1-R6, respectively.

The first to sixth fins F1-F6 may be formed respectively protruding from the substrate 100 in the first to sixth regions RI-R6 in the first to sixth Z directions Z1-Z6. In some embodiments, the first to sixth Z directions Z1-Z6 may all be the same vertical direction.

The first to sixth fins F1-F6 may extend in the first to sixth regions R1-R6 in the first to sixth X directions X1-X6. The first to sixth fins F1-F6 may have a long side and a short side. Although FIG. 1 illustrates long side directions respectively in the first to sixth X directions X1-X6 and short side directions respectively in the first to sixth Y directions Y1-Y6, example embodiments of the present inventive concepts are not limited thereto.

The first to sixth fins F1-F6 may be a part of the substrate 100 and/or may include an epitaxial layer grown from the substrate 100. For example, the first to sixth fins F1-F6 may include Si or SiGe.

Figure 9:
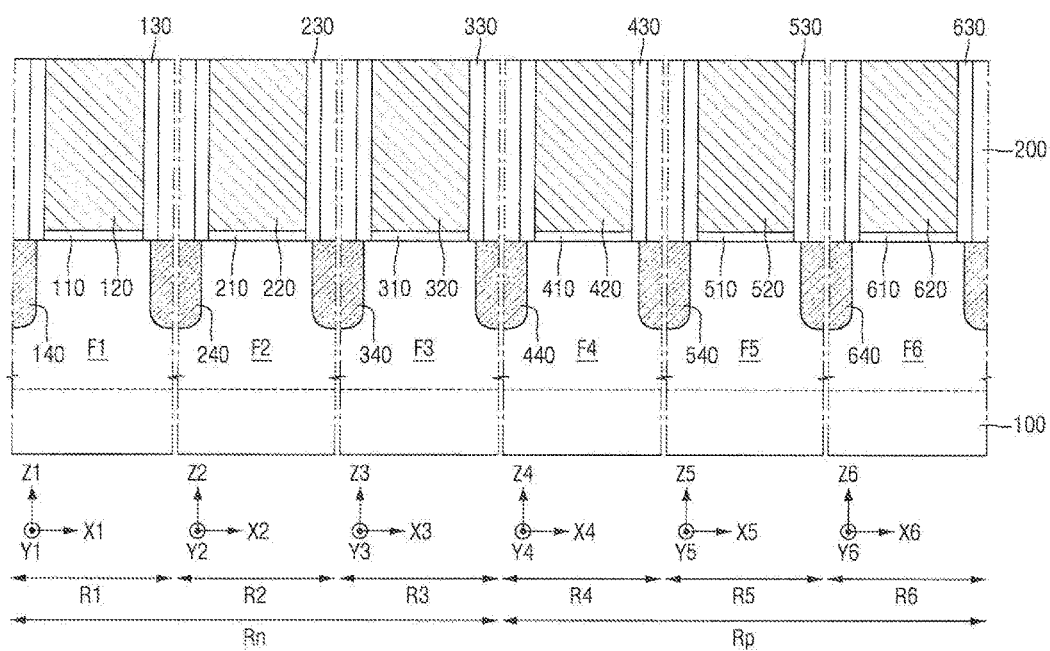

Next, referring to FIG. 9, first to sixth dummy gate insulating films 110, 210, 310, 410, 510, 610 (denoted herein as "110-610" for brevity), first to sixth dummy gate electrodes 120, 220, 320, 420, 520, 620 (denoted herein as "120-620" for brevity), and first to sixth spacers 130-630 may be formed.

The first to sixth dummy gate insulating films 110-610 may be formed on the substrate 100 of the first to sixth regions R1-R6, respectively. The first to sixth dummy gate insulating films 110-610 may include at least one of a silicon oxide film, a silicon nitride film, and/or a silicon oxynitride film.

The first to sixth dummy gate electrodes 120-620 may be subsequently formed. The first to sixth dummy gate electrodes 120-620 may be formed on the first to sixth dummy gate insulating films 110-610, respectively. The first to sixth dummy gate electrodes 120-620 may be formed from a conductor.

The first to sixth spacers 130-630 may be subsequently formed on side surfaces of the first to sixth dummy gate insulating films 110-610 and the first to sixth dummy gate electrodes 120-620. For example, the first to sixth spacers 130-630 may include at least one of silicon nitride (SiN), silicon oxynitride (SiON), silicon oxide (SiO$_2$), silicon oxycarbonitride (SiOCN), and/or a combination thereof.

The interlayer insulating film 200 for filling the remaining space may be subsequently formed, and a planarization process may be performed, thus exposing upper surfaces of the first to sixth dummy gate electrodes 120-620 and the first to sixth spacers 130-630.

Figure 10:
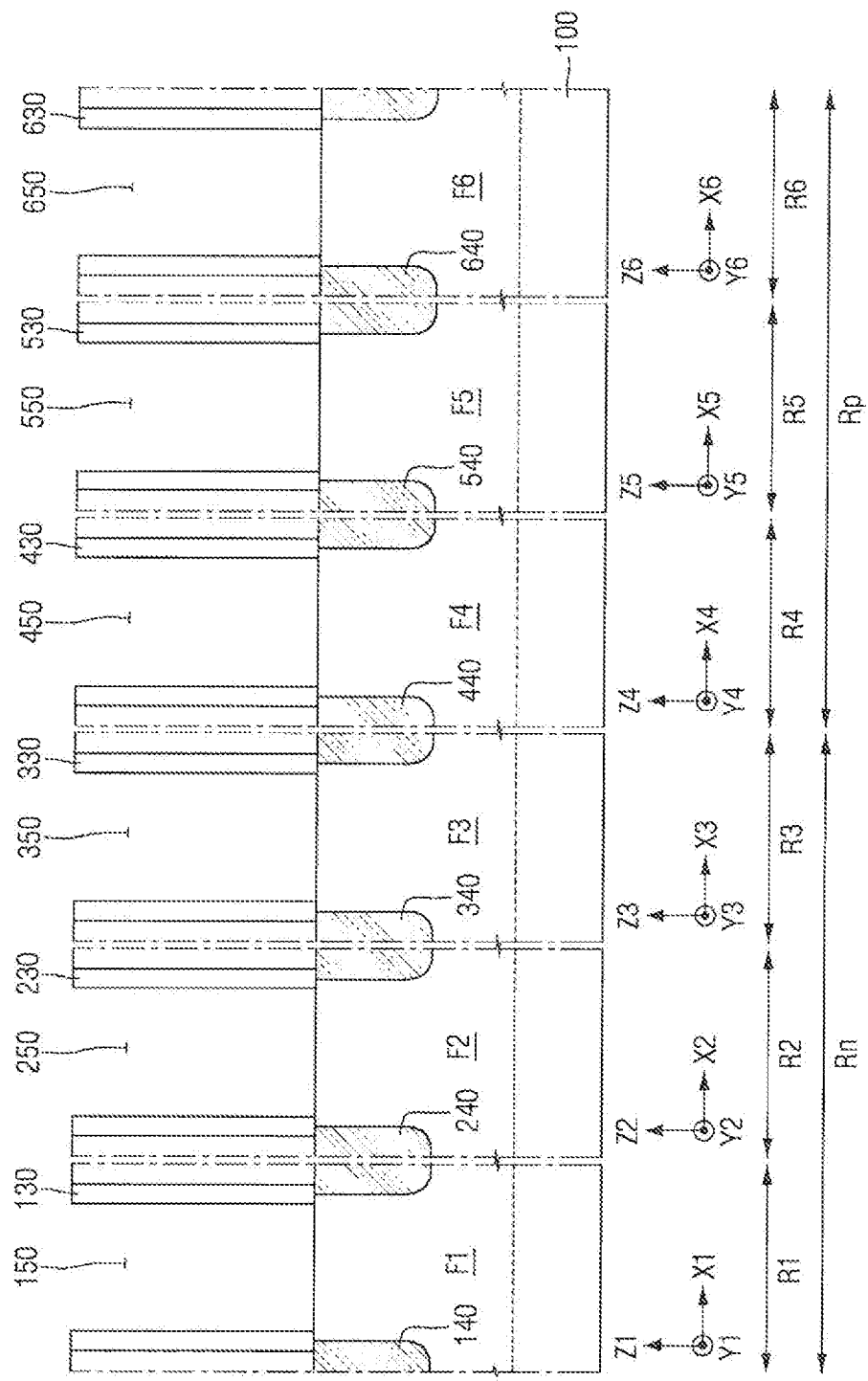

Referring to FIG. 10, the first to sixth gate trenches 150, 250, 350, 450, 550, 650 (denoted herein as "150-650" for brevity) may be formed.

The first to sixth gate trenches 150-650 may be formed by removing the first to sixth dummy gate electrodes 120-620 and the first to sixth dummy gate insulating films 110-610. Accordingly, bottom surfaces of the first to sixth gate trenches 150-650 may be the substrate 100, and the side surfaces may be the first to sixth spacers 130-630, respectively. In some embodiments, the first to sixth gate trenches 150-650 may expose portions of the upper surfaces of the first to sixth fins F1-F6.

Figure 11:
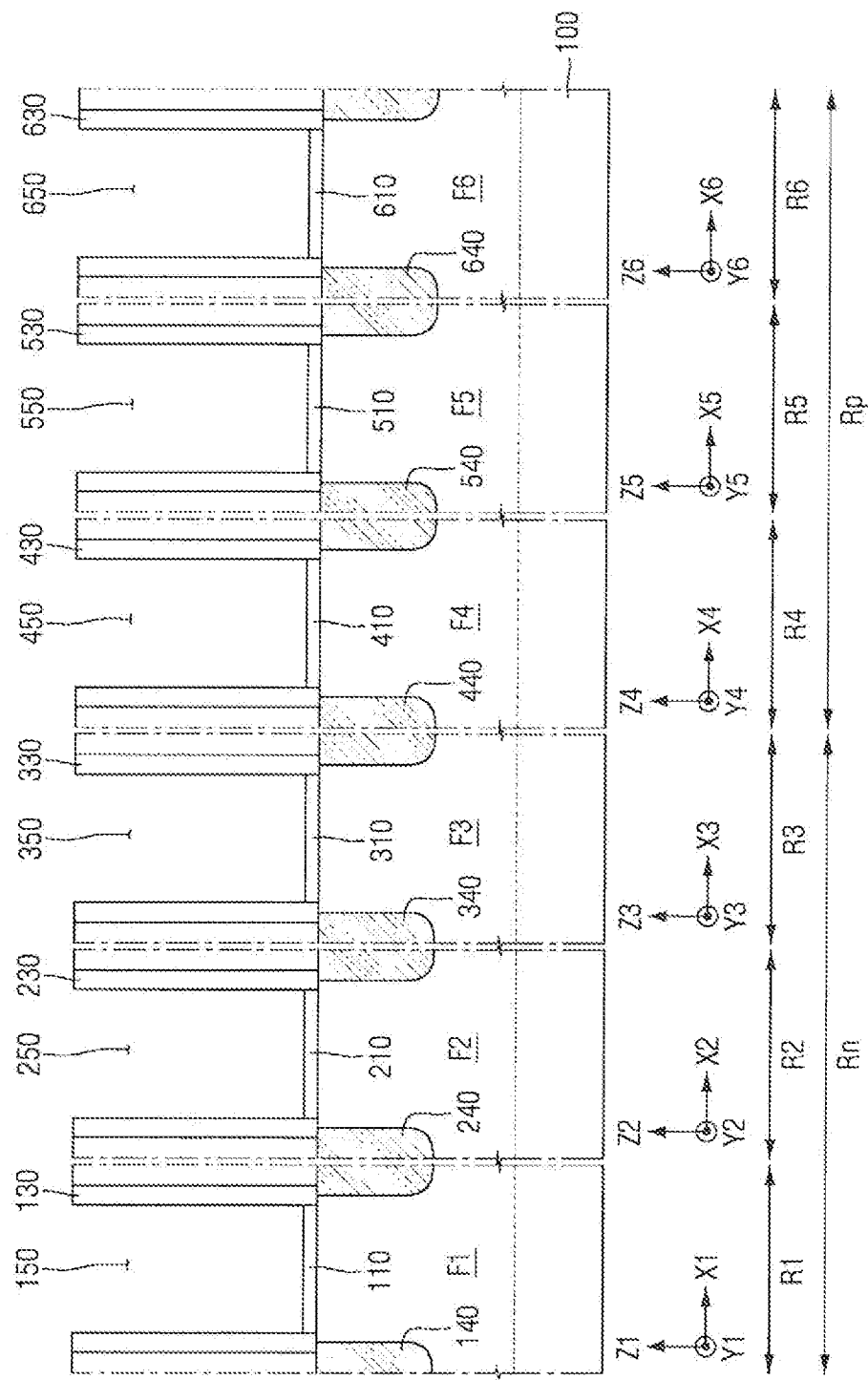

Referring to FIG. 11, the first to sixth interfacial layers 160-660 may be formed.

The first to sixth interfacial layers 160-660 may be formed on the first to sixth fins F1-F6 of the first to sixth regions R1-R6, respectively. The first to sixth interfacial layers 160-660 may be formed by oxidizing a portion of the first to sixth fins F1-F6, respectively. The first to sixth interfacial layers 160-660 may be formed along a profile of the first to sixth fins F1-F6 protruding upward higher than an upper surface of the field insulating film 105. When the first to sixth fins F1-F6 are a silicon fin-type pattern including silicon, the first to sixth interfacial layers 160-660 may include a silicon oxide film.

Figure 12:
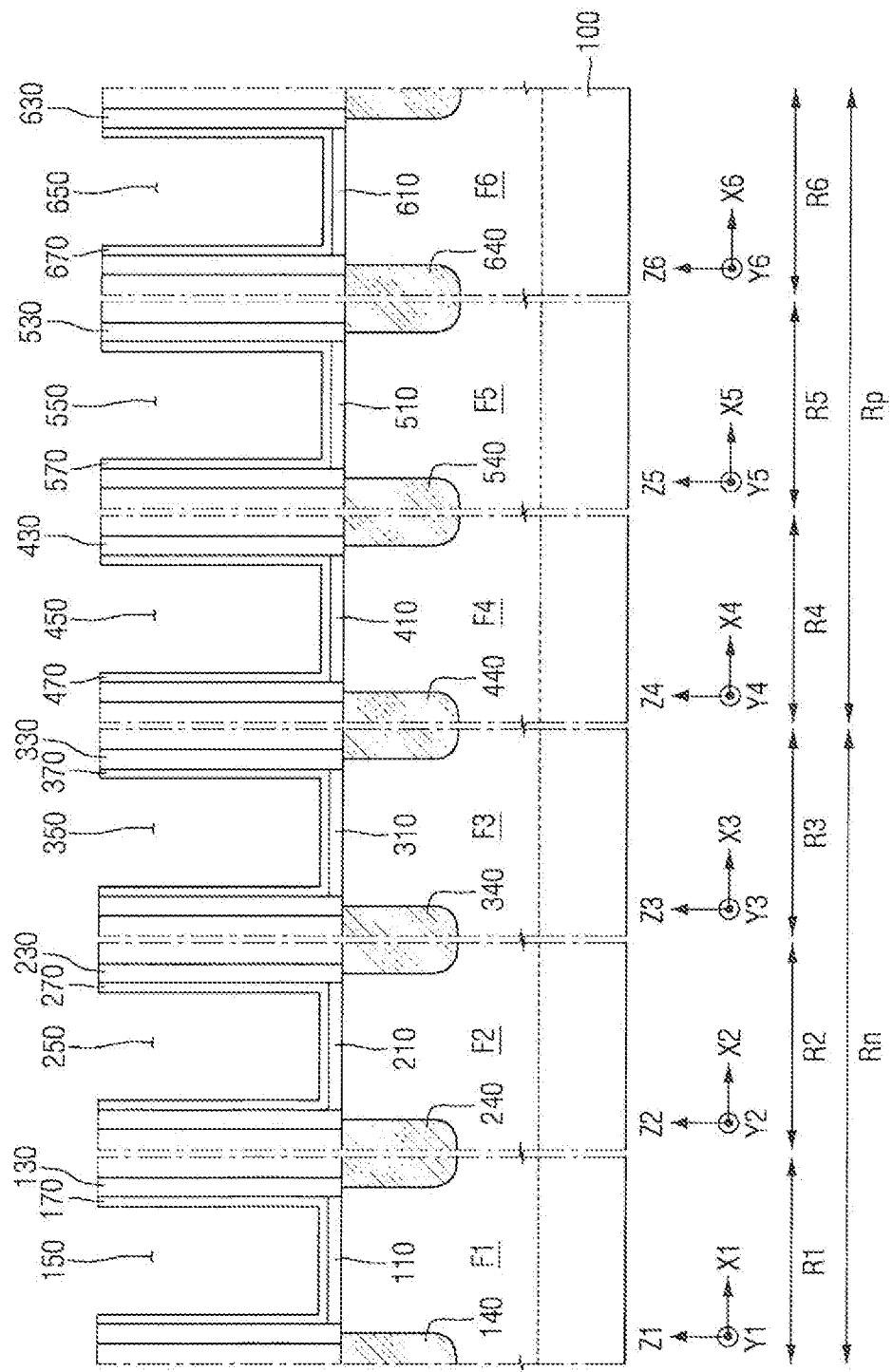

Referring to FIG. 12, the first to sixth high-k dielectric films 170-670 may be formed.

The first to sixth high-k dielectric films 170-670 may be formed on the first to sixth interfacial layers 160-660, respectively. The first to sixth high-k dielectric films 170-670 may be formed along upper surfaces of the first to sixth interfacial layers 160-660 and inner side surfaces of the first to sixth spacers 130-630, respectively. Accordingly, uppermost portions of the first to sixth high-k dielectric films 170-670 may have a same height as upper surfaces of the first to sixth spacers 130-630. The first to sixth high-k dielectric films 170-670 may include a high-k dielectric material having a higher dielectric constant than the silicon oxide film.

Figure 13:
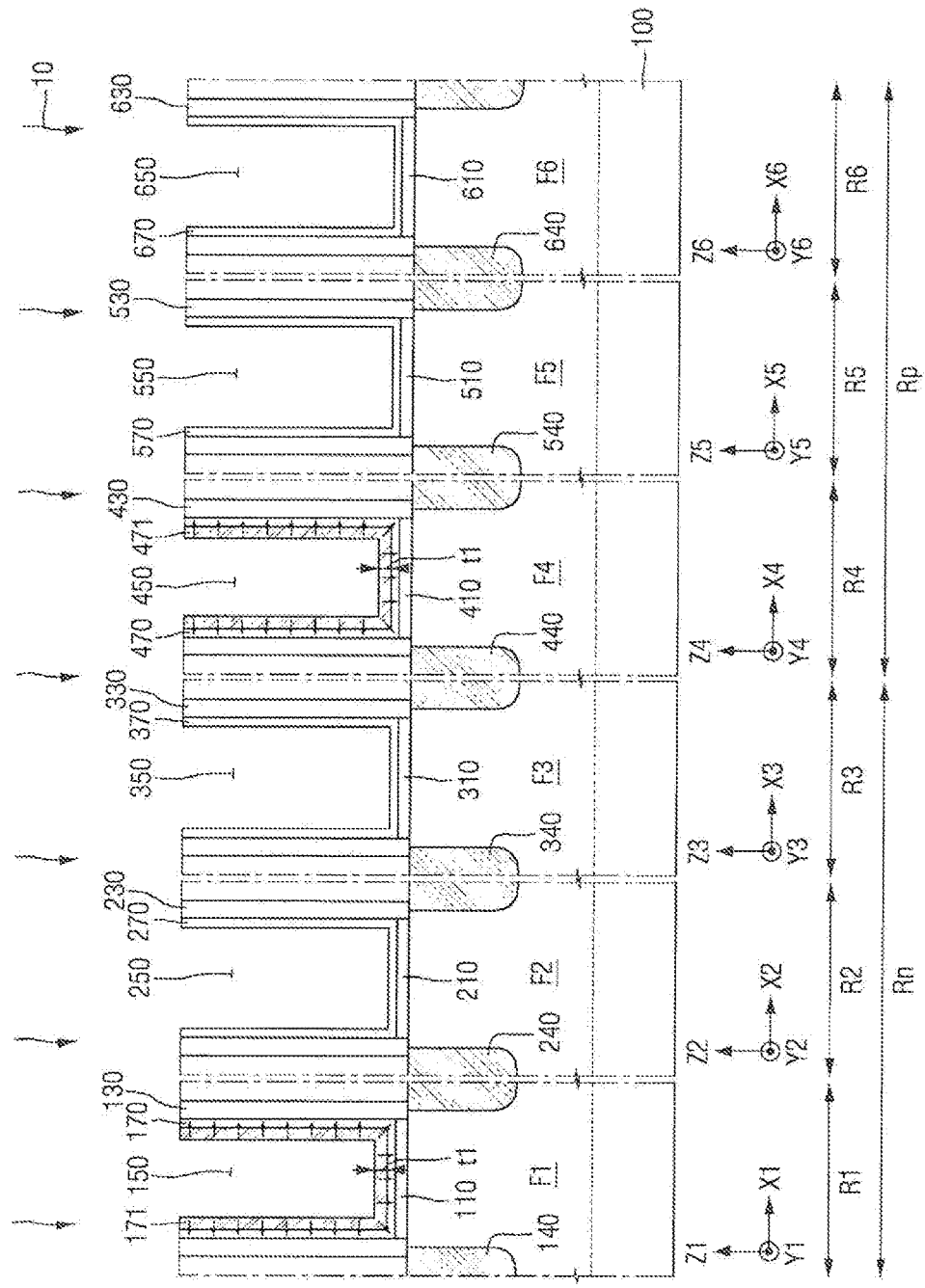

Referring to FIG. 13, a first diffusion film 171, 471 may be formed.

In some embodiments, the first diffusion film 171, 471 may be formed selectively in one or more specific regions.

For example, in some embodiments, the first diffusion film 171, 471 may be formed only in the first region R1 and/or the fourth region R4, and may not be formed in the second region R2, the third region R3, the fifth region R5, and/or the sixth region R6.

The first diffusion film 171, 471 may include a dipole forming element. The dipole forming element may be, for example, at least one of La, Nd, Eu, Dy, Ho and/or Yb. However, example embodiments of the present inventive concepts are not limited thereto. The first diffusion film 171, 471 may be an oxide film of the dipole forming element.

The first diffusion film 171, 471 may be formed with the first thickness t1. In some embodiments, because the first thickness t1 may cause an amount of diffusion of the dipole diffusing element to change, the first thickness t1 may be adjusted according to a desired threshold voltage. That is, a threshold voltage of the transistor in the first region R1 may become lower and a threshold voltage of the transistor in the fourth region R4 may become higher, when the first thickness t1 is increased.

A first annealing 10 may subsequently be performed. The first annealing 10 may be performed at a first time point. The first annealing 10 may be performed at a temperature of 500° C. to 800° C. With the first annealing 10, the dipole forming element of the first diffusion film 171, 471 may be diffused into the first high-k dielectric film 170 and the fourth high-k dielectric film 470. In some embodiments, the amount of diffusion of the dipole forming element may be increased when the temperature of the first annealing 10 is increased.

Accordingly, the threshold voltages of the transistors in the first region R1 and the fourth region R4, which will be formed later, may be adjusted by adjusting the temperature of the first annealing 10. Specifically, when the temperature of the first annealing 10 is increased, the threshold voltage of the transistor in the first region R1 may become lower, and the threshold voltage of the transistor in the fourth region R4 may become higher.

Figure 14:
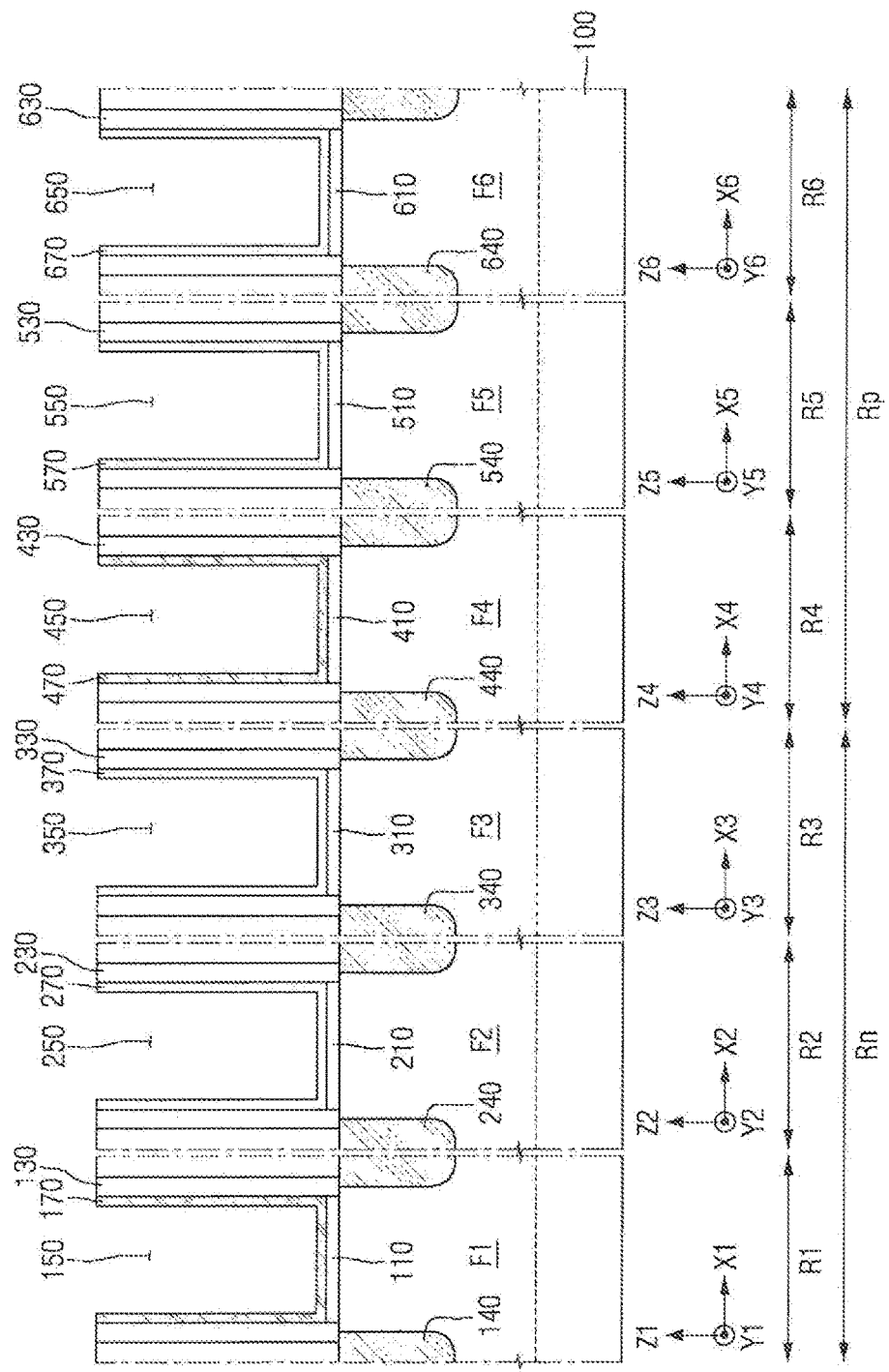

Referring to FIG. 14, the first diffusion film 171, 471 may be removed.

Because the first diffusion film 171, 471 may be a film temporarily formed for the purpose of diffusing the dipole forming element, the first diffusion film 171, 471 may thus be removed after the diffusion process. Accordingly, upper surfaces of the first high-k dielectric film 170 and the fourth high-k dielectric film 470 may be exposed again.

Removal of the first diffusion film 171, 471 may include the use of at least one of diluted sulfur peroxide (DSP), sulfuric acid ($H_2SO_4$), and deionized water (DI).

Due to the diffusion process, the concentrations of the dipole forming element in the first high-k dielectric film 170 and the fourth high-k dielectric film 470 may be higher than the concentrations of the dipole forming element in the second high-k dielectric film 270, the third high-k dielectric film 370, the fifth high-k dielectric film 570, and the sixth high-k dielectric film 670. In some embodiments, the concentration of the dipole forming element may be 0 in the second high-k dielectric film 270, the third high-k dielectric film 370, the fifth high-k dielectric film 570, and the sixth high-k dielectric film 670.

Figure 15:
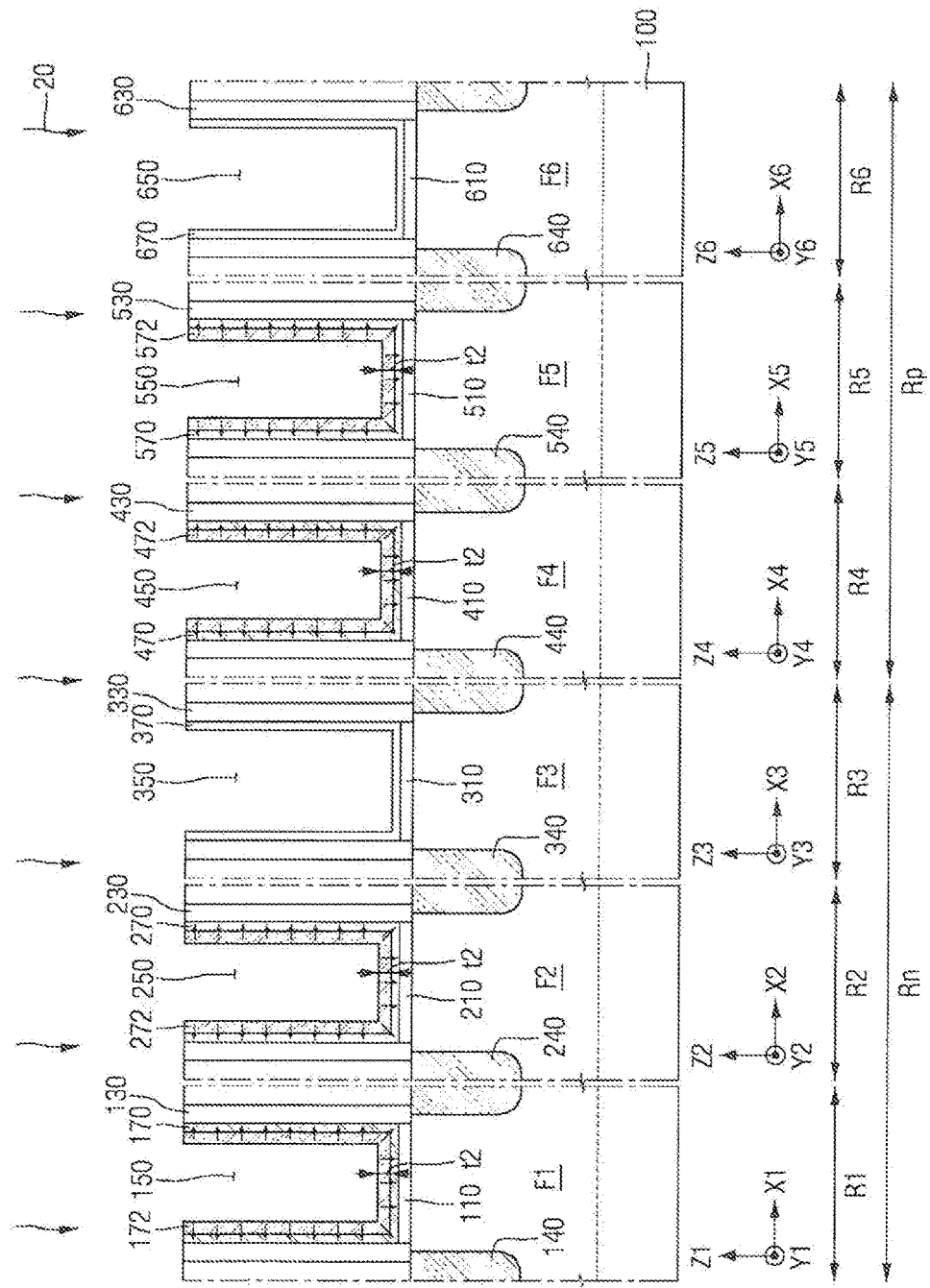

Referring to FIG. 15, a second diffusion film 172, 272, 472, 572 may be formed.

In some embodiments, the second diffusion film 172, 272, 472, 572 may be formed selectively in a specific region.

For example, in some embodiments, the second diffusion film 172, 272, 472, 572 may be formed only in the first region R1, the second region R2, the fourth region R4, and/or the fifth region R5, and may not be formed in the third region R3 and/or the sixth region R6.

The second diffusion film 172, 272, 472, 572 may include the dipole forming element. The dipole forming element may be, for example, at least one of La, Nd, Eu, Dy, Ho and/or Yb. However, example embodiments of the present inventive concepts are not limited thereto. The second diffusion film 172, 272, 472, 572 may be an oxide film of the dipole forming element.

The second diffusion film 172, 272, 472, 572 may be formed with the second thickness t2. In some embodiments, because the second thickness t2 may cause the amount of diffusion of the dipole forming element to change, the second thickness t2 may be adjusted according to a desired threshold voltage. That is, when the second thickness t2 is increased, the threshold voltages of the transistor in the first region R1 and the second region R2 may become lower, and the threshold voltages of the transistor in the fourth region R4 and the fifth region R5 may become higher. In some embodiments, the second thickness t2 may be same as, or different from the first thickness t1.

A second annealing 20 may subsequently be performed. The second annealing 20 may be performed at a second time point which is after the first time point. The second annealing 20 may be performed at a temperature of 500° C. to 800° C. With the second annealing 20, the dipole forming element in the second diffusion film 172, 272, 472, 572 may be diffused into the first high-k dielectric film 170, the second high-k dielectric film 270, the fourth high-k dielectric film 470, and the fifth high-k dielectric film 570. In some embodiments, as the temperature of the second annealing 20 is increased, the amount of diffusion of the dipole forming element may be increased. In some embodiments, the temperatures of the second annealing 20 and the temperature of the first annealing 10 may be same as, or different from each other.

Accordingly, a threshold voltage of the transistor in the first region R1, the second region R2, the fourth region R4, and the fifth region R5, which will be formed later, may be adjusted by adjusting the temperature of the second annealing 20. Specifically, when the temperature of the second annealing 20 is increased, threshold voltages of the transistor in the first region R1 and the second region R2 may become lower and threshold voltages of the transistor in the fourth region R4 and the fifth region R5 may become higher.

Figure 16:
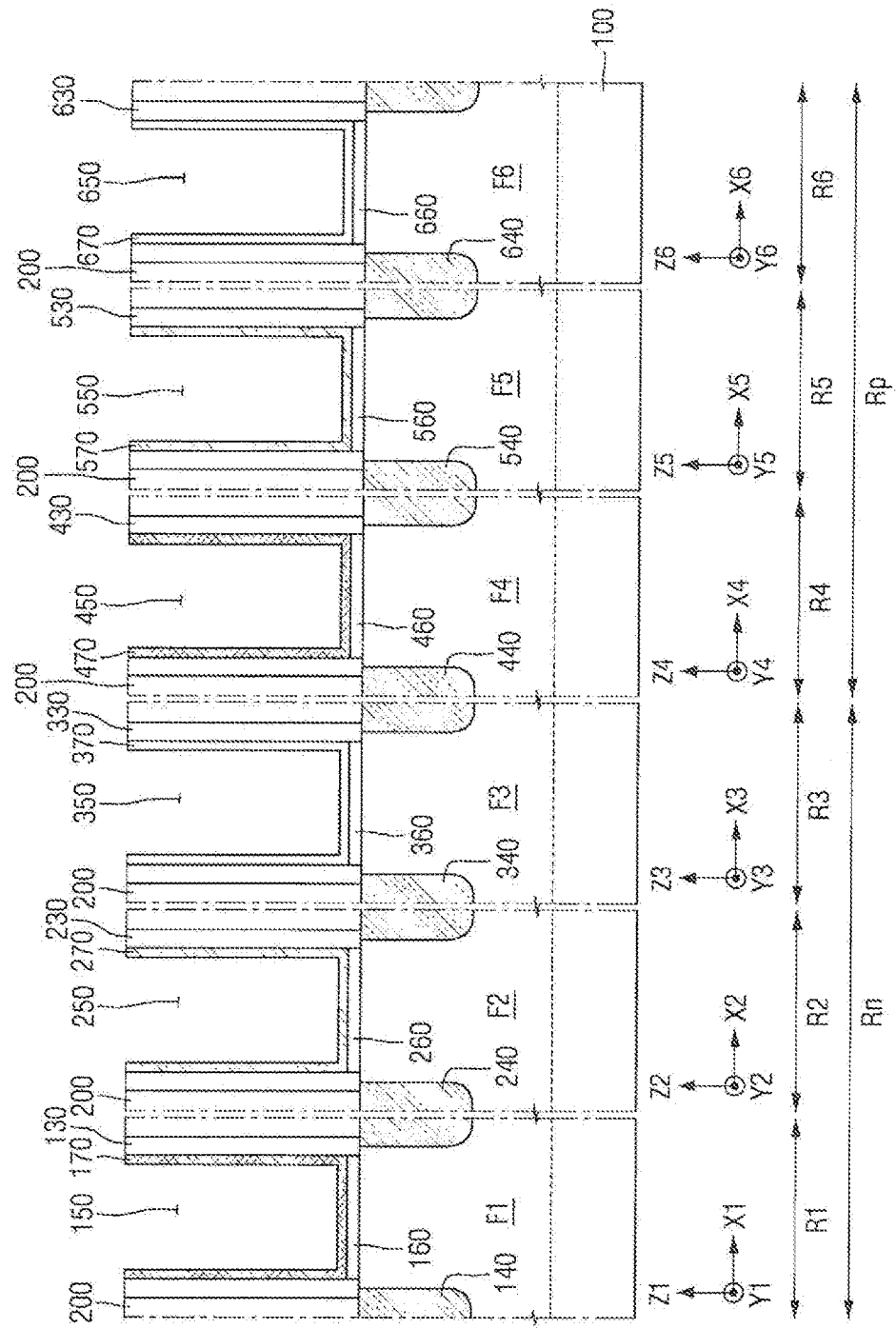

Referring to FIG. 16, the second diffusion film 172, 272, 472, 572 may be removed.

The second diffusion film 172, 272, 472, 572 may be a film temporarily formed for the purpose of diffusing the dipole forming element, and it may thus be removed after the diffusion process. Accordingly, upper surfaces of the first high-k dielectric film 170, the second high-k dielectric film 270, the fourth high-k dielectric film 470 and the fifth high-k dielectric film 570 may be exposed again.

Removal of the second diffusion film 172, 272, 472, 572 may include the use at least one of diluted sulfur peroxide (DSP), sulfuric acid ($H_2SO_4$), and/or deionized water (DI).

Due to the diffusion process, the concentrations of the dipole forming element in the first high-k dielectric film 170, the second high-k dielectric film 270, the fourth high-k dielectric film 470, and the fifth high-k dielectric film 570 may be higher than concentrations of the dipole forming element in the third high-k dielectric film 370 and the sixth high-k dielectric film 670. In some embodiments, the concentration of the dipole forming element may be 0 in the third high-k dielectric film 370 and the sixth high-k dielectric film 670.

Further, because the first high-k dielectric film 170 and the fourth high-k dielectric film 470 go through two diffusion processes, the concentration of the dipole forming element in the first high-k dielectric film 170 and the fourth high-k dielectric film 470 may be higher than that of the second high-k dielectric film 270 and the fifth high-k dielectric film 570.

Figure 17:
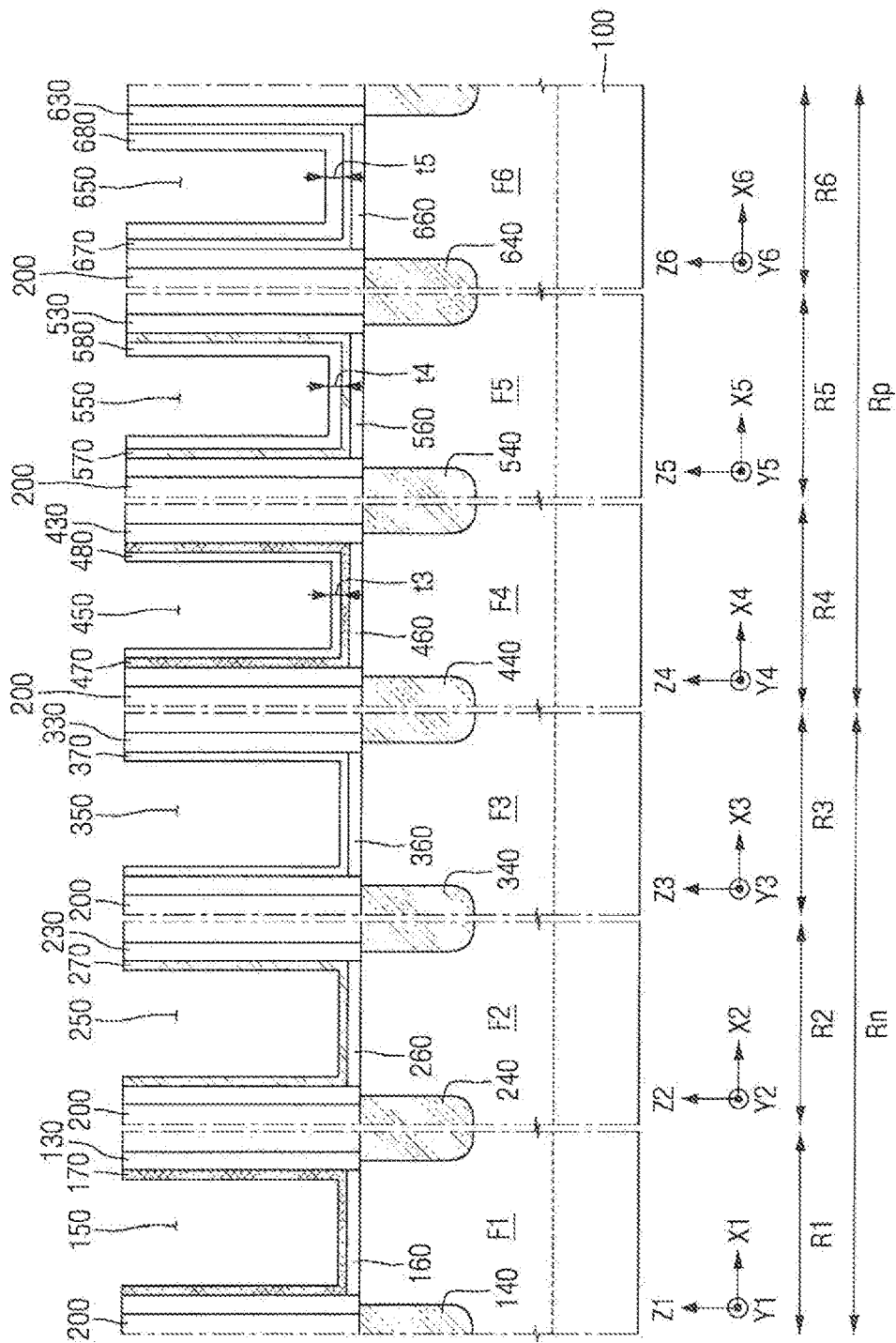

Referring to FIG. 17, the fourth to sixth lower work function adjustment films 480-680 may subsequently be formed.

The fourth to sixth lower work function films 480-680 may be formed on the fourth to sixth high-k dielectric films 470-670, respectively. The fourth to sixth lower work function adjustment films 480-680 may have third to fifth thicknesses t3-t5, respectively. In some embodiments, the third thickness t3 may be less than the fourth thickness t4, and the fourth thickness t4 may be less than the fifth thickness t5.

The thicknesses provided above may be related with the concentrations of the dipole forming element in the fourth to sixth high-k dielectric films 470-670. That is, the concentrations of the dipole forming element in the fourth to sixth high-k dielectric films 470-670 may be fourth to sixth concentrations, respectively, among which the fourth concentration may be greatest and the sixth concentration may be lowest. Accordingly, the fourth to sixth lower work function adjustment films 480-680 may be formed with different thicknesses even when they are formed for the same duration of time in the forming process.

That is, according to concentration of the dipole forming element in the high-k dielectric film positioned adjacent, thicknesses of the fourth to sixth lower work function adjustment films 480-680 may be varied. Specifically, as concentration of the dipole forming element in the high-k dielectric film positioned adjacent is increased, thicknesses of the fourth to sixth lower work function adjustment films 480-680 may be decreased.

The fourth to sixth lower work function adjustment films 480-680 may include a p-type work function adjustment material. That is, the fourth to sixth lower work function adjustment films 480-680 may perform a function of the work function adjustment film. That is, threshold voltages Vt of the transistors in the fourth region R4 to the sixth region R6 may be adjusted by the fourth to sixth lower work function adjustment films 480-680.

The fourth to sixth lower work function adjustment films 480-680 may include at least one of TiN or TaN. However, example embodiments of the present inventive concepts are not limited thereto.

Selective formation of the fourth to sixth lower work function adjustment films 480-680 in the fourth to sixth regions R4-R6 may be performed by first forming the lower work function adjustment films on an entire region and next removing the films from the first to third regions R1-R3.

When thicknesses of the fourth to sixth work function adjustment films 480-680 are thick, removal may not be easy. The method for fabricating the semiconductor devices according to some example embodiments of the present inventive concepts may adjust the threshold voltages with the first to sixth high-k dielectric films 170-670. Accordingly, the thickness of the lower work function adjustment film may not be necessarily thicker, and the lower work function adjustment film may be easily removed in the removal process.

Figure 18:
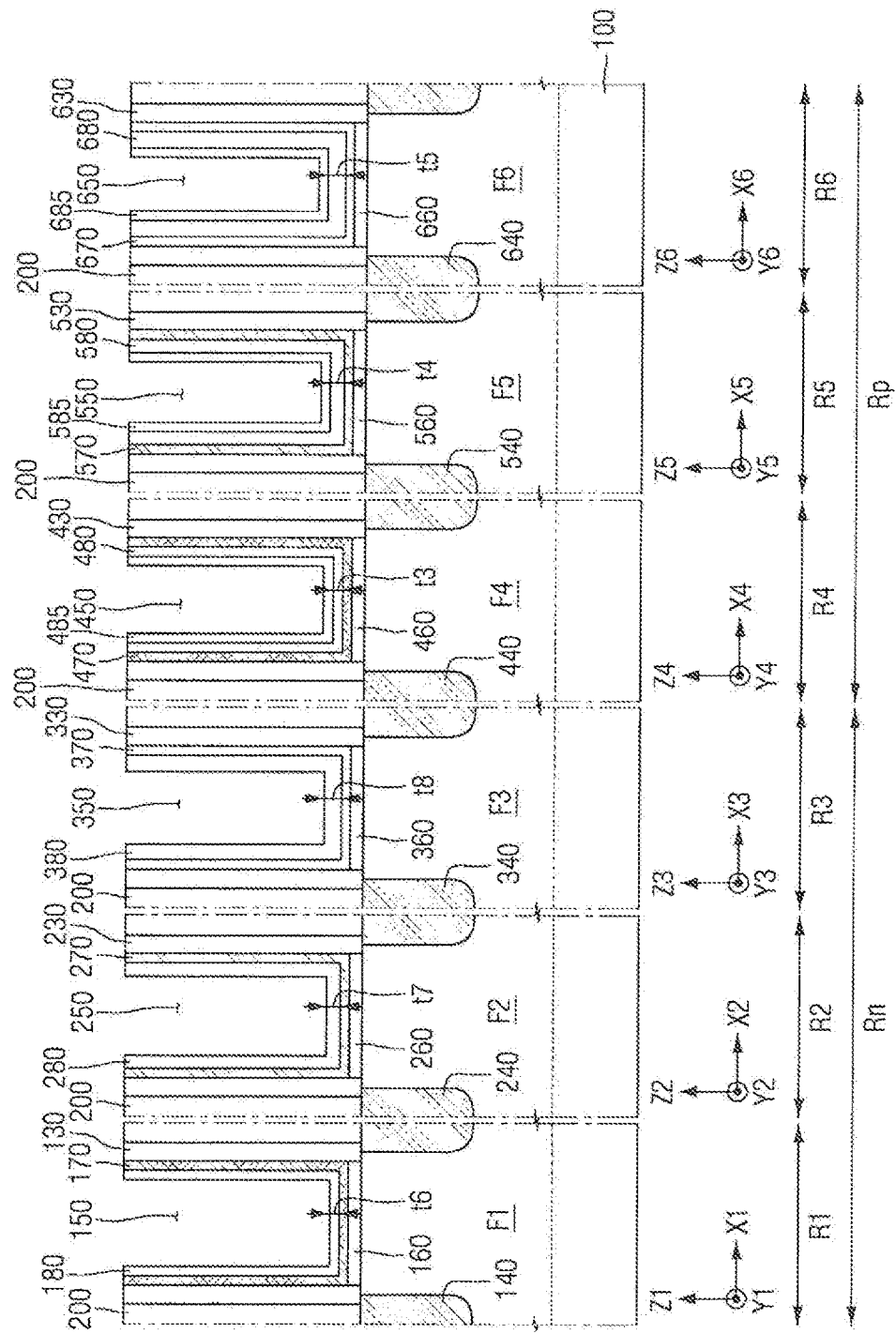

Referring to FIG. 18, the first to third lower work function adjustment films 180-380 and the first to third intermediate work function adjustment films 485-685 may be formed.

The first to third lower work function adjustment films 180-380 may be respectively formed on the first to third high-k dielectric films 170-370. The first to third lower work function adjustment films 180-380 may have sixth to eighth thicknesses t6-t8. In some embodiments, the sixth thickness t6 may be less than the seventh thickness t7, and the seventh thickness may be less than the eighth thickness t8.

The thicknesses provided above may be related with concentration of the dipole forming element in the first to third high-k dielectric films 170-370. That is, concentrations of the dipole forming element in the first to third high-k dielectric films 170-370 may be respectively first to third concentrations; In some embodiments, the first concentration may be greatest and the third concentration may be lowest. Accordingly, the first to third lower work function adjustment films 180-380 may be formed with different thicknesses even when they are formed for the same duration of time in the forming process.

That is, according to concentration of the dipole forming element in the high-k dielectric film positioned adjacent, thicknesses of the first to third lower work function adjustment films 180-380 may be varied. Specifically, when the concentration of the dipole forming element in the high-k dielectric film positioned adjacent is increased, thicknesses of the first to third lower work function adjustment films 180-380 may be decreased.

The first to third intermediate work function adjustment films 485-685 may be formed on the fourth to sixth lower work function adjustment films 480-680, respectively. The first to third intermediate work function adjustment films 485-685 may be formed with the same thickness.

The first to third intermediate work function adjustment films 485-685 may be the same material as the first to third lower work function adjustment films 180-380. That is, the first to third intermediate work function adjustment films 485-685 and the first to third lower work function adjustment films 180-380 may be formed with the same process. Note that different thicknesses may be obtained even in the same process according to whether there are the first to third high-k dielectric films 170-370 below and whether there are the fourth to sixth lower work function adjustment films 480-680 below.

The first to third intermediate work function films 485-685 may include at least one of TiN or TaN. However, example embodiments of the present inventive concepts are not limited thereto.

The first to third intermediate work function adjustment films 485-685 and the first to third lower work function adjustment films 180-380 may serve as a barrier film. That is, the first to third intermediate work function adjustment films 485-685 and the first to third lower work function adjustment films 180-380 may serve to prevent the first to sixth upper work function adjustment films 190-690, which will be formed later, from contacting the first to sixth high-k dielectric films 170-670, respectively. As a result, they may play a role of preventing materials of the first to sixth upper work function adjustment films 190-690 from being diffused into the first to sixth high-k dielectric films 170-670.

Figure 19:
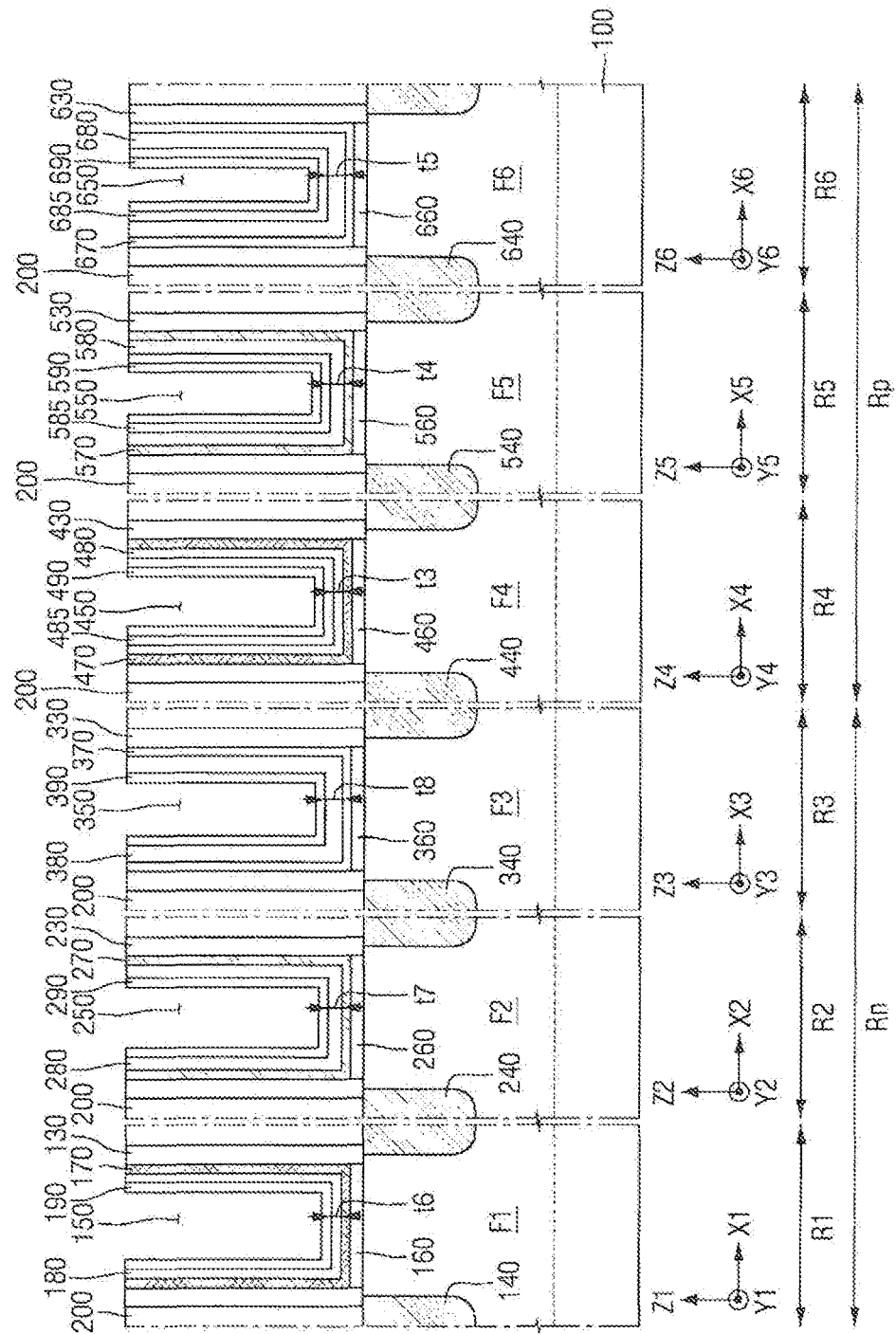

Referring to FIG. 19, the first to sixth upper work function adjustment films 190-690 may be formed.

The first to third upper work function adjustment films 190-390 may be formed on the first to third lower work function adjustment films 180-380, respectively. The first to third upper work function adjustment films 190-390 may be formed with the same thickness.

The fourth to sixth upper work function adjustment films 490-690 may be formed on the first to third intermediate work function adjustment films 485-685, respectively. The fourth to sixth upper work function adjustment films 490-690 may be formed with the same thickness.

The first to sixth upper work function adjustment films 190-690 may all include the same material. The first to sixth upper work function adjustment films 190-690 may be an n-type work function adjustment material. For example, the first to sixth upper work function adjustment films 190-690 may include TiAlC, but the present inventive concepts are not limited thereto.

That is, the transistor formed in the n-type region Rn may include an n-type work function adjustment material, and the transistor formed in the p-type region Rp may include both a p-type work function adjustment material and an n-type work function adjustment material.

Referring again to FIG. 2, the first to sixth filling films 195-695 may be formed.

The fourth to sixth filling films 195-695 may be formed on the first to sixth upper work function adjustment films 190-690, respectively. The first to sixth filling films 195-695 may complete the first to sixth gate structures G1-G6. The first to sixth filling films 195-695 may include at least one of W or TiN, but the present inventive concepts are not limited thereto.

In FIGS. 7 to 19, the first to sixth high-k dielectric films 170-670, the first to sixth lower work function adjustment films 180-680, the first to third intermediate work function adjustment films 485-685, the first to sixth upper work function adjustment films 190-690 and the first to sixth filling films 195-695 are illustrated as being in isolated devices in each of the forming processes, but the present inventive concepts are not limited thereto. That is, the films may all be stacked in a connected state in different regions until device isolation is realized at the end by, for example, the planarization process. In this case, efficiency and cost saving may be maximized because there is no waste in the process.

According to some embodiments, more than two cycles of the diffusion film and annealing process may be performed. As a result, multiple threshold voltages, which are finer and have greater differences, may be formed.

According to methods for fabricating the semiconductor devices of some example embodiments of the present inventive concepts, the thicknesses of the first to sixth lower work function adjustment films 180-680 may be automatically adjusted according to the concentrations of the dipole forming element in the first to sixth high-k dielectric films 170-670, but other than that, a structure of varying the thicknesses of the work function adjustment films may not be included.

Accordingly, except for the first diffusion film 171, 471 and the second diffusion film 172, 272, 472, 572, the process may be simplified by performing only one selective etching for dividing the n-type regions Rn and the p-type regions Rp in the first to sixth regions R1-R6. In some embodiments, the film, such as the first and second diffusion films, to be removed has a thin thickness and may be easily removed.

Methods for fabricating a semiconductor device according to other example embodiments of the present inventive concepts will be described with reference to FIGS. 2, 7 to 14, and 16 to 20. Elements or operations overlapping with some example embodiments described above will be mentioned as briefly as possible or omitted for the sake of brevity.

Figure 20:
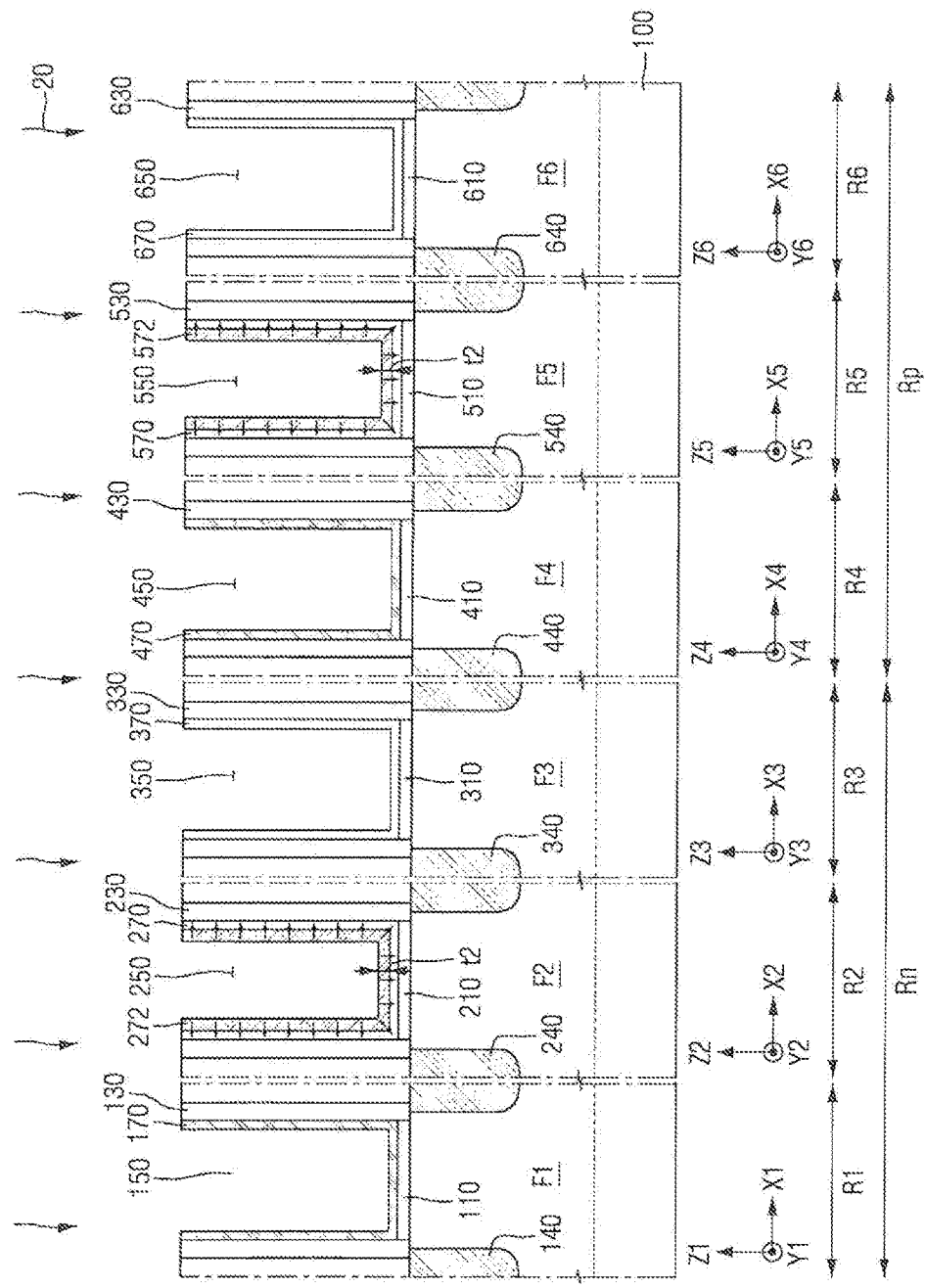
FIG. 20 is a view illustrating a stage of fabrication of a method for fabricating semiconductor devices according to some example embodiments of the present inventive concepts.

FIG. 20 is a view illustrating a stage of fabrication of a method for fabricating semiconductor devices according to some example embodiments of the present inventive concepts.

In the methods for fabricating the semiconductor devices according to some example embodiments of the present inventive concepts, the processes may be identical to the processes of FIGS. 7 to 14 of the above embodiments described above.

Next, referring to FIG. 20, the second diffusion film 272, 572 may be formed. In some embodiments, the second diffusion film 272, 572 may be selectively formed in a specific region.

For example, in some embodiments, the second diffusion film 272, 572 may be formed only in the second region R2 and the fifth region R5, and may not be formed in the first region R1, the third region R3, the fourth region R4, and the sixth region R6.

The second diffusion film 272, 572 may include the dipole forming element. The dipole forming element may be, for example, at least one of La, Nd, Eu, Dy, Ho and Yb. However, example embodiments of the present inventive concepts are not limited thereto. The second diffusion film 272, 572 may be an oxide film of the dipole forming element.

The second diffusion film 272, 572 may be formed with the second thickness t2. In some embodiments, because the second thickness t2 may cause the amount of diffusion of the dipole diffusing element to change, the second thickness t2 may be adjusted according to a required threshold voltage. That is, when the second thickness t2 is increased, a threshold voltage of the transistor in the second region R2 may become lower and a threshold voltage of the transistor in the fifth region R5 may become higher. In this case, the second thickness t2 may be same as, or different from the first thickness t1.

The second annealing 20 may subsequently be performed. The second annealing 20 may be performed at a second time point which is after the first time point. The second annealing 20 may be performed at a temperature of 500° C. to 800° C. Due to the second annealing 20, the dipole forming element in the second diffusion film 272, 572 may be diffused into the second high-k dielectric film 270 and the fifth high-k dielectric film 570. In some embodiments, when the temperature of the second annealing 20 is increased, the amount of diffusion of the dipole forming element may increase. In some embodiments, the temperatures of the second annealing 20 and temperature of the first annealing 10 may be same as, or different from each other.

Accordingly, the threshold voltages of the transistor in the second region R2 and the fifth region R5, which will be formed later, may be adjusted by adjusting the temperature of the second annealing 20. Specifically, when the temperature of the second annealing 20 is increased, the threshold voltage of the transistor in the second region R2 may become lower and the threshold voltage of the transistor in the fifth region R5 may become higher.

When the first thickness t1 and the second thickness t2 are same as each other, the temperature of the first annealing 10 and the temperature of the second annealing 20 may be different from each other. That is, when the first diffusion film 171, 471 and the second diffusion film 272, 572 with the same thickness are subject to different annealing temperatures from one another other, the threshold voltages of the transistor in the first region R1 and the fourth region R4 may be different from the threshold voltages of the transistor in the second region R2 and the fifth region R5.

Conversely, when the temperature of the first annealing 10 and the temperature of the second annealing 20 are same as each other, the first thickness t1 and the second thickness t2 may be different from each other. That is, when the first annealing 10 and the second annealing 20 are performed at the same temperature, the first diffusion film 171, 471 and the second diffusion film 272, 572 may have different thicknesses from each other, and the threshold voltages of the transistor in the first region R1 and the fourth region R4, and the second region R2 and the fifth region R5 may be varied from each other.

In some embodiments, the first thickness t1 and the second thickness t2 may be different from each other, and further, the temperatures of the first annealing 10 and the second annealing 20 may be different from each other.

Subsequently, the example method for fabricating the semiconductor devices according to some example embodiments of the present inventive concepts may include identical steps as the steps of FIGS. 16 to 19 and 2 of the embodiments described above.

Though the figures discussed herein include six regions R1-R6 including six gate structures G1-G6 on six fins F1-F6, the present inventive concepts are not limited thereto. It will be understood that the devices and methods described herein may be applied to more than six regions, fins, and/or gate structures. For example, fewer than six or more than six regions may be provided. Similarly fewer than six or more than six gate structures may be provided. In some embodiments, more than one gate structure (e.g. G1-G6) may be provided within a given region. The grouping and number of the structures described herein are provided to illustrate the present inventive concepts and not to limit the configuration solely to those illustrated herein.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device, comprising:
a substrate comprising first, second, and third regions;
first, second, and third interfacial layers on the substrate in the first, second, and third regions, respectively;
first, second, and third high-k dielectric films on the first, second, and third interfacial layers, respectively,
wherein concentrations of a dipole forming element in the first, second, and third high-k dielectric films are first, second, and third concentrations, respectively,
wherein the first concentration is greater than the second concentration, and
wherein the second concentration is greater than the third concentration;
first, second, and third work function adjustment films on the first, second, and third high-k dielectric films, respectively,
wherein thicknesses of the first, second, and third work function adjustment films are first, second, and third thicknesses, respectively,
wherein the first thickness is less than the second thickness, and
wherein the second thickness is less than the third thickness; and
first, second, and third filling films on the first, second, and third work function adjustment films, respectively.

2. The semiconductor device of claim 1, wherein the dipole forming element comprises at least one of La, Nd, Eu, Dy, Ho and Yb.

3. The semiconductor device of claim 1, further comprising:
a first gate structure comprising the first high-k dielectric film, the first work function adjustment film, and the first filling film;
a second gate structure comprising the second high-k dielectric film, the second work function adjustment film, and the second filling film;
a third gate structure comprising the third high-k dielectric film, the third work function adjustment film, and the third filling film; and
first, second, and third spacers on side surfaces of the first, second, and third gate structures, respectively.

4. The semiconductor device of claim 3, further comprising first, second, and third source/drains on both sides of the first, second, and third gate structures, respectively.

5. The semiconductor device of claim 3, wherein the first, second, and third gate structures respectively have first, second, and third threshold voltages, and
wherein a magnitude of the second threshold voltage is between magnitudes of the first and third threshold voltages.

6. The semiconductor device of claim 1, wherein the third concentration is 0.

7. The semiconductor device of claim 1, wherein the first, second, and third work function adjustment films further comprise:
first, second, and third lower work function adjustment films in direct contact with the first, second, and third high-k dielectric films, respectively; and
first, second, and third upper work function adjustment films formed on the first, second, and third lower work function adjustment films, respectively.

8. The semiconductor device of claim 7, wherein the first, second, and third lower work function adjustment films have fourth, fifth, and sixth thicknesses, respectively,
wherein the fourth thickness is less than the fifth thickness, and the fifth thickness is less than the sixth thickness, and
wherein thicknesses of the first, second, and third upper work function adjustment films are the same.

9. The semiconductor device of claim 7, further comprising first, second, and third intermediate work function adjustment films between the first, second, and third lower work function adjustment films and the first, second, and third upper work function adjustment films, respectively.

10. The semiconductor device of claim 9, wherein thicknesses of the first, second, and third intermediate work function adjustment films are the same.

11. A semiconductor device, comprising:
a substrate comprising an n-type region and a p-type region,
wherein the n-type region comprises first, second, and third regions and the p-type region comprises fourth, fifth, and sixth regions;
first, second, third, fourth, fifth, and sixth interfacial layers on the first, second, third, fourth, fifth, and sixth regions, respectively, of the substrate;
first, second, third, fourth, fifth, and sixth high-k dielectric films on the first, second, third, fourth, fifth, and sixth interfacial layers, respectively,
wherein the first and fourth high-k dielectric films comprise a first concentration of a dipole forming element,
wherein the second and fifth high-k dielectric films comprise a second concentration of the dipole forming element,
wherein the third and sixth high-k dielectric films comprise a third concentration of the dipole forming element,
wherein the first concentration is greater than the second concentration, and
wherein the second concentration is greater than the third concentration;
first, second, and third work function adjustment films on the first, second, and third high-k dielectric films,
wherein thicknesses of the first, second, and third work function adjustment films are first, second, and third thicknesses, respectively,
wherein the first thickness is less than the second thickness, and
wherein the second thickness is less than the third thickness; and
fourth, fifth, and sixth work function adjustment films on the fourth to sixth high-k dielectric films,
wherein thicknesses of the fourth to sixth work function adjustment films are fourth, fifth, and sixth thicknesses,
wherein the fourth thickness is less than the fifth thickness, and wherein the fifth thickness is less than the sixth thickness.

12. The semiconductor device of claim 11, wherein the first, second, and third work function adjustment films further comprise:
   first, second, and third lower work function adjustment films that are in direct contact with the first, second, and third high-k dielectric films, respectively; and
   first, second, and third upper work function adjustment films that are in direct contact with the first, second, and third lower work function adjustment films respectively, and that are on the first, second, and third lower work function adjustment films.

13. The semiconductor device of claim 12, wherein the fourth to sixth work function adjustment films further comprise:
   fourth, fifth, and sixth lower work function adjustment films in direct contact with the fourth to sixth high-k dielectric films, respectively;
   first, second, and third intermediate work function adjustment films on the fourth to sixth lower work function adjustment films, respectively; and
   fourth, fifth, and sixth upper work function adjustment films on the first to third intermediate work function adjustment films, respectively.

14. The semiconductor device of claim 13, wherein the first, second, and third lower work function adjustment films and the first, second, and third intermediate work function adjustment films comprise a common material.

15. The semiconductor device of claim 13, wherein the first, second, third, fourth, fifth, and sixth upper work function adjustment films comprise a common material.

16. A semiconductor device, comprising:
   a substrate;
   a first fin structure protruding from a first region of the substrate;
   a second fin structure protruding from a second region of the substrate;
   a third fin structure protruding from a third region of the substrate;
   a first gate structure on the first fin structure;
   a second gate structure on the second fin structure; and
   a third gate structure on the third fin structure,
   wherein the first gate structure comprises:
      a first dielectric film comprising a first concentration of a dipole forming element; and
      a first work function adjustment film having a first thickness,
   wherein the second gate structure comprises:
      a second dielectric film comprising a second concentration of the dipole forming element; and
      a second work function adjustment film having a second thickness, wherein the third gate structure comprises:
      a third dielectric film comprising a third concentration of the dipole forming element; and
      a third work function adjustment film having a third thickness,
   wherein the first concentration of the dipole forming element is greater than the second concentration of the dipole forming element,
   wherein the second concentration of the dipole forming element is greater than the third concentration of the dipole forming element,
   wherein the first thickness is smaller than the second thickness, and
   wherein the second thickness is smaller than the third thickness.

17. The semiconductor device of claim 16, wherein the substrate comprises an n-type portion and a p-type portion,
   wherein the first region, the second region, and the third region are in the n-type portion,
   wherein the semiconductor device further comprises:
      a fourth region in the p-type portion of the substrate;
      a fourth fin structure protruding from the fourth region of the substrate; and
      a fourth gate structure on the fourth fin structure,
   wherein the fourth gate structure comprises a fourth dielectric film comprising:
      a fourth concentration of the dipole forming element; and
      a fourth work function adjustment film, and
   wherein the fourth concentration equals the first concentration.

18. The semiconductor device of claim 17, wherein the first work function adjustment film comprises:
   a first lower work function adjustment film that is in direct contact with the first dielectric film; and
   a first upper work function adjustment film that is in direct contact with the first lower work function adjustment film, and
   wherein the fourth work function adjustment film comprises:
   a second lower work function adjustment film that is in direct contact with the fourth dielectric film;
   an intermediate work function adjustment film on the second lower work function adjustment film and comprising a same material as the first lower work function adjustment film; and
   a second upper work function adjustment film that is on the intermediate work function adjustment film.

19. The semiconductor device of claim 18, wherein the first upper work function adjustment film and the second upper work function adjustment film comprise an n-type work function adjustment material, and
   wherein the second lower work function adjustment film comprises a p-type work function adjustment material.

20. The semiconductor device of claim 18, wherein a height of the first lower work function adjustment film and a height of the first upper work function adjustment film are smaller than a height of the first dielectric film.

* * * * *